(12) United States Patent
Park et al.

(10) Patent No.: US 8,315,080 B2
(45) Date of Patent: Nov. 20, 2012

(54) LUMINESCENCE DEVICE AND METHOD OF MANUFACTURING THE SAME

(75) Inventors: Jea Gun Park, Gyeonggi-Do (KR); Gon Sub Lee, Seoul (KR); Su Hwan Lee, Seoul (KR); Dal Ho Kim, Seoul (KR); Sung Ho Seo, Seoul (KR); Woo Sik Nam, Gyeonggi-Do (KR); Hyun Min Seung, Seoul (KR); Jong Dae Lee, Gyeonggi-Do (KR); Dong Won Shin, Seoul (KR)

(73) Assignee: IUCF-HYU, Seoul (KR)

( * ) Notice: Subject to any disclaimer, the term of this patent is extended or adjusted under 35 U.S.C. 154(b) by 274 days.

(21) Appl. No.: 12/597,168

(22) PCT Filed: Apr. 23, 2008

(86) PCT No.: PCT/KR2008/002309
§ 371 (c)(1),
(2), (4) Date: Mar. 29, 2010

(87) PCT Pub. No.: WO2008/130194
PCT Pub. Date: Oct. 30, 2008

(65) Prior Publication Data
US 2010/0208507 A1    Aug. 19, 2010

(30) Foreign Application Priority Data

Apr. 24, 2007  (KR) .................. 10-2007-0039844
Apr. 22, 2008  (KR) .................. 10-2008-0037169

(51) Int. Cl.
G11C 13/04    (2006.01)
(52) U.S. Cl. ........................................ 365/111; 365/168
(58) Field of Classification Search .................. 365/111, 365/168
See application file for complete search history.

(56) References Cited

U.S. PATENT DOCUMENTS

2006/0145599 A1*  7/2006  Stegamat et al. ............. 313/504

FOREIGN PATENT DOCUMENTS

| GB | 1425100 A | * | 2/1976 |
| JP | 09-116106 | | 5/1997 |
| JP | 2004-040094 | | 2/2004 |
| JP | 2004513513 A | | 4/2004 |
| KR | 10-2006-0070350 | | 6/2006 |
| KR | 100652135 B1 | | 11/2006 |
| WO | 02-37500 A1 | | 5/2002 |
| WO | 2005-089288 A2 | | 9/2005 |

OTHER PUBLICATIONS

Liping Ma et al., "Nonvolatile electrical bistability of organic/metal-nanocluster/organic system", Applied Physics Letters, American Institute of Physics, vol. 82, No. 9, Mar. 3, 2003.

Ricky J. Tseng et al, Nanoparticle-induced negative differential resistance and memory effect in polymer bistable light-emitting device, Applied Physics Letters 88, 123506 (2006).

* cited by examiner

Primary Examiner — Michael Tran
(74) Attorney, Agent, or Firm — Renaissance IP Law Group LLP

(57) ABSTRACT

Provided are a luminescent device and a method of manufacturing the same. The luminescent device includes a charge trapping layer having bistable conductance and negative differential resistance (NDR) characteristics, and an organic luminescent layer electrically connected to the charge trapping layer. The charge trapping layer comprise a nanocrystal layer intervened in an organic layer, and the nanocrystal layer comprises a plurality of nanocrystals.

31 Claims, 17 Drawing Sheets

(a)

(b)

(a)

(b)

(a)　　　　　　　　　　　　　　(b)

(a)                  (b)

LUMINESCENCE DEVICE AND METHOD OF MANUFACTURING THE SAME

TECHNICAL FIELD

The present disclosure relates to a luminescent device and a method of manufacturing the same, and more particularly, to a luminescent device where a charge trapping layer and an organic luminescent layer are formed between conductive layers.

BACKGROUND ART

An organic electroluminescent device, which is considered as a promising next-generation flat panel display to replace a liquid crystal display (LCD) and a plasma display panel (PDP), generally includes multi-layered organic compounds of illuminants, and emits light as a current flows when a voltage is applied thereto. Such an organic electroluminescent device is also called an organic electroluminescent display (OELD) or an organic light emitting diode (OLED).

While an LCD displays an image by selectively transmitting light and a PDP displays an image through plasma discharge, an OLED displays an image through electroluminescent mechanism. That is, an OLED includes two electrodes, i.e., cathode and anode, and an organic luminescent material interposed therebetween, and emits light in such a way that holes and electrons are injected into an organic luminescent layer from the anode and cathode, respectively, and then recombined with each other to create a recombination energy stimulating organic molecules. Such an OLED is being popularly applied to small-sized displays because it is self-luminescent and also has several advantageous merits such as wide viewing angle, high-definition, high-quality image and high response time. In particular, the OLED is being focused as next-generation displays for televisions and flexible displays.

Recently, an active matrix organic light emitting diode (AMOLED) is being predominantly used among various OLEDs because it adopts an active driving method capable of individually controlling pixels that are minimum units forming a screen. In the AMOLED, a scanning line is formed in one direction, and a signal line and a power supply line are formed in another direction crossing the one direction, and thereby one pixel area is defined. A switching thin film transistor (TFT) connected to the scanning lines and the signal lines, a storage capacitor and a driving thin film transistor are formed in the pixel area. The storage capacitor is connected to the switching thin film transistor and the power supply line, and the driving thin film transistor configured to supply current is connected to the storage capacitor and the power supply line. And the OLED is formed to be connected to the driving thin film transistor.

In the AMOLED that supplies current through a TFT, carrier mobility becomes poor if an active layer used as a channel of the TFT is formed of amorphous silicon. Accordingly, polysilicon is used for the active layer because it has a high carrier mobility of 10 $cm^2$/Vsec or more. However, a fabrication process of a polysilicon TFT is performed at a very high temperature, which makes it difficult to fabricate a flexible display.

Since a glass substrate used to fabricate the TFT is deformed at a high temperature of 600° C. or more, a low temperature polysilicon (LTPS), which is obtained by crystallizing amorphous silicon at a low temperature, has been proposed to form polysilicon. To crystallize the amorphous silicon, an excimer laser annealing (ELA) process has been suggested. According to the ELA process, however, an overlap region onto which laser is duplicately irradiated may appear so that the overlap region differs in crystallization degree from other regions where laser is not duplicately irradiated. This leads to a decrease in stability. For example, current amount of a TFT may be varied depending on device characteristics changed by crystallization degree. In particular, the current amount of the TFT may be varied depending on threshold voltage difference. Further, each TFT has a different grain boundary, and thus has nonuniform electrical properties.

Amorphous silicon or polysilicon should be formed in a typical display because the typical display employs TFTs. Further, a TFT configured to compensate for a current should be formed because an OLED is driven by a current. Because four or six TFTs should be used at present, a fabrication process becomes too complicated and fabrication cost is increased. Moreover, the TFT decreases an aperture ratio in a bottom emission type device so that the aperture ratio is considerably reduced to 30-50%.

A related art display has only one current level, and thus a voltage should be divided into 64 levels to realize 64 gray scale levels using only one current level. However, the related art display has a limitation in that it is difficult to realize a desired gray scale if a dividable voltage level is too narrow.

DISCLOSURE

Technical Problem

The present disclosure provides a luminescent device and a method of manufacturing the same capable of improving process efficiency and operating speed as well as an aperture ratio without using a thin film transistor.

The present disclosure also provides a luminescent device and a method of manufacturing the same capable of improving an aperture ratio and operating speed and easily controlling a gray scale by forming a charge trapping layer and an organic luminescent layer between conductive layers.

Technical Solution

In accordance with an exemplary embodiment, a luminescent device includes: a charge trapping layer having bistable conductance and negative differential resistance (NDR) characteristics; and an organic luminescent layer electrically connected to the charge trapping layer.

The luminescent device may further include an upper conductive layer and a lower conductive layer disposed over and under the charge trapping layer and the organic luminescent layer, respectively. The luminescent device may further include an intermediate conductive layer disposed between the charge trapping layer and the organic luminescent layer.

The luminescent may further include at least one of a hole injection layer and a hole transport layer disposed between the organic luminescent layer and one of the conductive layers. The luminescent device may further include at least one of an electron transport layer and an electron injection layer disposed between the organic luminescent layer and another one of the conductive layers.

The charge trapping layer may include an organic layer. The charge trapping layer may further include a nanocrystal layer having a plurality of nanocrystals existing in the organic layer. The nanocrystal layer may further include a barrier layer surrounding the plurality of nanocrystals. The nanocrystal may include at least one of aluminum (Al), magnesium (Mg), zinc (Zn), nickel (Ni), iron (Fe), copper (Cu), gold (Au)

and silver (Ag), or an alloy thereof. The barrier layer may include an oxide, or an organic material.

The organic layer may include at least one of a low-molecular organic material and a high-molecular organic material.

The luminescent device may perform a program operation, an erase operation or a read operation depending on a level of a voltage applied between the upper conductive layer and the lower conductive layer. The luminescent device may emit light during the read operation.

An absolute value of an erase voltage may be greater than an absolute value of a program voltage, and an absolute value of a read voltage may be smaller than the absolute value of the program voltage.

The program voltage, the erase voltage and the read voltage may be positive voltages negative voltages.

Program voltages with different levels may be applied between the upper and lower conductive layers to perform the program operation, and the program voltages may be selected from a range of a threshold voltage of the luminescent device or higher and not greater than an NDR region. A current with a plurality of levels may be output during the read operation depending on levels of the program voltages.

Read voltages with different levels may be applied between the upper and lower conductive layers to perform the read operation, and the read voltages may be selected from a range less than the threshold voltage of the luminescent device. A current with a plurality of levels may be output during the read operation depending on levels of the read voltages.

Read voltages with different levels may be applied between the upper and lower conductive layers to perform the read operation, and the read voltages may be selected from a range less than the threshold voltage of the luminescent device. A current with a plurality of levels may be output during the read operation depending on levels of the read voltages.

The luminescent device may be a bottom emission type or a top emission type luminescent device. The luminescent device may further include a flexible substrate.

In accordance with another exemplary embodiment, a method of manufacturing a luminescent device includes: forming a lower conductive layer on a substrate; forming an upper conductive layer on the lower conductive layer; forming a charge trapping layer having bistable conductance and NDR characteristics between the lower conductive layer and the upper conductive layer; and forming an organic luminescent layer electrically connected to the charge trapping layer between the lower conductive layer and the upper conductive layer.

The charge trapping layer may include an organic layer. The forming of the charge trapping layer may further include forming a nanocrystal layer in the organic layer.

The organic layer may include a lower organic layer and an upper organic layer, and the organic layer may include a low-molecular conductive organic material.

The forming of the nanocrystal layer may include: forming a metal layer between the lower organic layer and the upper organic layer; and oxidizing the metal layer to form a nanocrystal and a barrier layer surrounding the nanocrystal. The oxidizing of the metal layer may be performed using oxygen plasma.

The organic layer may include a lower organic layer and an upper organic layer, and the lower and upper organic layers may include a high-molecular conductive organic material.

The forming of the nanocrystal layer may include: forming a first barrier layer, a metal layer and a second barrier layer between the lower and the upper organic layers; and performing a curing process on the first barrier layer, the metal layer and the second barrier layer to form a nanocrystal and a barrier layer surrounding the nanocrystal, the barrier layer having the first barrier layer and the second barrier layer.

The first and second barrier layers may include a metal oxide.

The organic layer and the nanocrystal layer may be formed by dispersing a nanocrystal into an organic material, spin-coating the organic material onto the substrate, and then performing a thermal treatment.

The nanocrystal layer may include the nanocrystal and a barrier layer surrounding the nanocrystal, and may be formed by adding and dispersing a barrier material into an organic material, spin-coating the organic material onto the substrate, and performing a thermal treatment.

The method may further include forming an intermediate conductive layer between the organic layer and the organic luminescent layer. The substrate may be a flexible substrate.

Advantageous Effects

As described above, in accordance with the exemplary embodiments, it is possible to manufacture a luminescent device with a simple structure, thus improving process efficiency and reliability of the device. Furthermore, since a TFT is not required in a display if the display is implemented by the use of the luminescent device of the exemplary embodiments, an entire device can be utilized as a display. This allows an aperture ratio to be increased to nearly 100%.

Also, in accordance with the exemplary embodiments, programming, erasing and reading speeds of a luminescent device are in the range of several nanoseconds to several tens of nanoseconds, and thus an operating speed of the device can be improved significantly.

Further, in accordance with the exemplary embodiments, the luminescent device has a variety of current levels depending on a program voltage and a read voltage. Accordingly, it is possible to realize 256 gray scale levels using such a variety of current levels.

Moreover, in accordance with the exemplary embodiments, since the luminescent device has low power consumption and a temperature increase is very small accordingly, a flexible display can be implemented. Also, it is possible to realize a wearable display that can be worn on the human body because the luminescent device is formed of almost organic materials.

DESCRIPTION OF DRAWINGS

Exemplary embodiments can be understood in more detail from the following description taken in conjunction with the accompanying drawings, in which.

BEST MODE

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
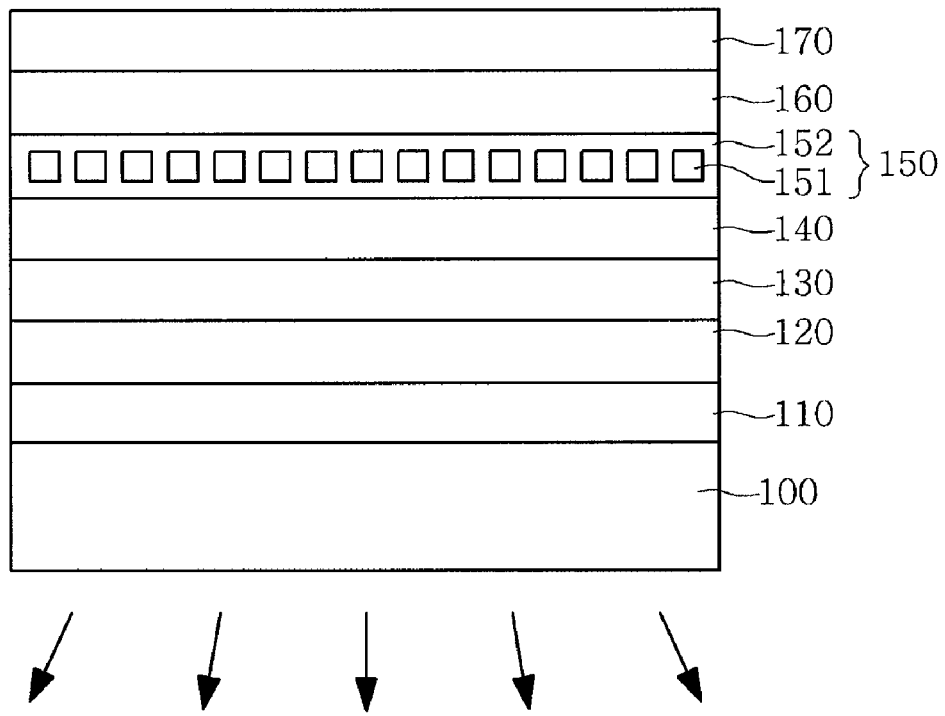
FIG. 1 is a cross-sectional view of a luminescent device in accordance with an exemplary embodiment.

FIG. 1 is a cross-sectional view of a luminescent device in accordance with an exemplary embodiment. Specifically, FIG. 1 illustrates a bottom emission type luminescent device.

Referring to FIG. 1, an organic luminescent layer 120 is disposed between a first conductive layer 110 and a second conductive layer 130, and a charge trapping layer is disposed between the second conductive layer 130 and a third conductive layer 170. The luminescent device in accordance with this embodiment includes the first conductive layer 110, the organic luminescent layer 120, the second conductive layer 130, a first organic layer 140, a nanocrystal layer 150, a second organic layer 160, and the third conductive layer 170, which are sequentially stacked over a substrate 100. Therefore, the first organic layer 140, the nanocrystal layer 150 and the second organic layer 160 form the charge trapping layer. At least one of a hole injection layer and a hole transport layer may be further provided between the first conductive layer 110 and the organic luminescent layer 120. Likewise, an electron injection layer may be further provided between the organic luminescent layer 120 and the second conductive layer 130.

The substrate 100 includes a light-transmitting substrate. For example, the substrate 100 may include an insulation substrate, a semiconductor substrate, or a conductive substrate. More specifically, the substrate 100 may include at least one of a plastic substrate (PE, PES, PET, PEN, etc.), a glass substrate, an aluminum oxide (Al2O3) substrate, a silicon carbide (SiC) substrate, a gallium arsenide (GaAs) substrate, a gallium phosphide (GaP) substrate, a lithium aluminum oxide (LiAl2O3) substrate, a boron nitride (BN) substrate, an aluminum nitride (AlN) substrate, a silicon-on-insulator (SOI) substrate, and a gallium nitride (GaN) substrate. When a semiconductor substrate or a conductive substrate is used as the substrate 100, an insulator should be provided between the first conductive layer 110 and the substrate 100 to insulate them from each other. In addition, a flexible substrate may be used as the substrate 100, which makes it possible to realize a flexible display or a wearable display.

The first conductive layer 110, which serves as an electrode for supplying holes, is formed of a transparent metal oxide having a high work function and allowing light to be emitted outside the device. For instance, the first conductive layer 110 is formed of indium tin oxide (ITO) to approximately 150 nm thick. In addition to the ITO, the first conductive layer 110 may be formed of chemically-doped conjugated polymer including polythiopene with excellent stability. Alternatively, the first conductive layer 110 may be formed of a metallic material with a high work function. In this case, it is possible to prevent the reduction in efficiency through non-radiative recombination at the first conductive layer 110.

The organic luminescent layer 120, which functions to generate light through the recombination of holes and electrons, is formed to approximately 60 nm thick using a high- or low-molecular material. The low-molecular material used as the organic luminescent layer 120 may include hydroxyquinoline aluminum (Alq3) or the like, and the high-molecular material used as the organic luminescent layer 120 may include poly(p-phenylenevinylene) (PPV), poly(thiophene)s ((PTh)s), Cyano-PPV, poly(p-phenylene) (PPP) and poly(fluorene)s). As described above, the hole injection layer and the hole transport layer may be further provided between the first conductive layer 110 and the organic luminescent layer 120. The hole injection layer may be formed to approximately 20 nm thick using copper phthaloyanine (CuPc), and the hole transport layer may be formed to approximately 40 nm thick using a low-molecular material such as α-NPD or a high-molecular material such as poly(n-vinylcarbazole) (PVK). Likewise, the electron transport layer and the electron injection layer may be further provided between the organic luminescent layer 120 and the second conductive layer 140. The electron transport layer may be formed of Alq3, and the electron injection layer may be formed of lithium fluorine (LiF). Herein, the electron transport layer and the electron injection layer may be formed to approximately 0.5 nm thick, respectively.

The second conductive layer 130, which serves as an electrode for injecting electrons into the organic luminescent layer 120, may be formed of a material with electrical conductivity to a thickness ranging from approximately 20 nm to approximately 150 nm. The second conductive layer 130 may be formed of a metal having low electrical resistance and excellent interfacial properties with a conductive organic material. For instance, the second conductive layer 130 may be formed of aluminum (Al), silver (Ag), gold (Au), platinum (Pt) or copper (Cu). Particularly, the second conductive layer 130 may be formed of a metal with a low work function so as to achieve high current density in electron injection by lowering a barrier between the organic luminescent layer 120 and the second conductive layer 130. Hence, the second conductive layer 130 may be formed of Al, which is relatively more stable in air.

The first organic layer 140 may be formed in a thickness range of approximately 5 nm to approximately 50 nm using a high- or low-molecular material. The high-molecular material may include PVK or polystyrene (Ps), and the low-molecular material may include at least one of AIDCN, α-NPD and Alq3. The first organic layer 140 may have bistable conductance, that is, two conductance states at the same voltage.

The nanocrystal layer 150 maintains program or erase state of the luminescent device through charging or discharging. The nanocrystal layer 150 includes nanocrystals 151 and a barrier layer 152. The nanocrystals 151 may be formed of at least one of aluminum (Al), magnesium (Mg), zinc (Zn), nickel (Ni), iron (Fe), copper (Cu), gold (Au) and silver (Ag), or an alloy thereof. The barrier layer 152 surrounds the nanocrystals 151, and is formed of an oxide. For example, the nanocrystal 151 may be formed of Al, and the barrier layer 152 may be formed of AlxOy. The nanocrystal layer 150 may be formed by depositing metal in an evaporation deposition chamber and oxidizing it. The nanocrystal layer 150 may have a monolayered structure, or a multi-layered structure. When the nanocrystal layer 150 has the monolayered structure, it may be formed to a thickness ranging from approximately 1 nm to approximately 40 nm. When the nanocrystal layer 150 has the multi-layered structure, one to ten monolayered crystal layers may be stacked in sequence.

Similarly to the first organic layer 140, the second organic layer 160 may be formed in a thickness range of approximately 5 nm to approximately 50 nm using at least one of a high-molecular material such as PVK and Ps, and a low-molecular material such as AIDCN, α-NPD and Alq3.

The third conductive layer 170 serves as an electrode for accumulating charges in the nanocrystal layer 150. Similarly to the second conductive layer 130, the third conductive layer 170 may be formed in a thickness range of approximately 2 nm to approximately 80 nm using all the materials with electrical conductivity. In particular, the third conductive layer 170 may be formed of Al.

A thickness of each of the layers in the luminescent device in accordance with this embodiment is merely illustrated for convenience in description, and thus it is not limited thereto.

In the luminescent device in accordance with this exemplary embodiment of FIG. 1, the organic luminescent layer and the organic layer may be formed through the combination of a high-molecular material and a low-molecular material. That is, it is possible to manufacture the luminescent device by respectively forming the organic luminescent layer and the organic layer of a high-molecular material and a high-molecular material, a high-molecular material and a low-molecular material, a low-molecular material and a high molecular material, or a low-molecular material and a low-molecular material. Here, the high-molecular material of the organic luminescent layer may include PPV, (PTh)s, Cyano-PPV, PPP, poly(fluorene)s, or the like, and the low-molecular material may include Alq3 or the like. The high-molecular material of the organic layer may include PVK or Ps, and the low-molecular material may include AIDC, α-NPD or Alq3.

In the luminescent device in accordance with the exemplary embodiment, the nanocrystal layer 150 is shaped such that the barrier layer 152 surrounds the nanocrystals 151. That is, the nanocrystal layer 150 is formed through oxidation of metal elements. However, the present invention is not limited thereto, and thus the nanocrystal layer 150 may be formed in various ways. For example, a first barrier layer, a metal layer and a second barrier layer are formed between the first and second organic layers 140 and 160, and then cured to thereby form the nanocrystal layer 150 where the nanocrystals are surrounded by the barrier layer. Alternatively, the nanocrystal layer 150 and an organic layer may be formed by forming an organic material where nanocrystals surrounded by the barrier layer are dispersed. Various methods of forming the nanocrystal layer 150 will be described later.

Figure 2:
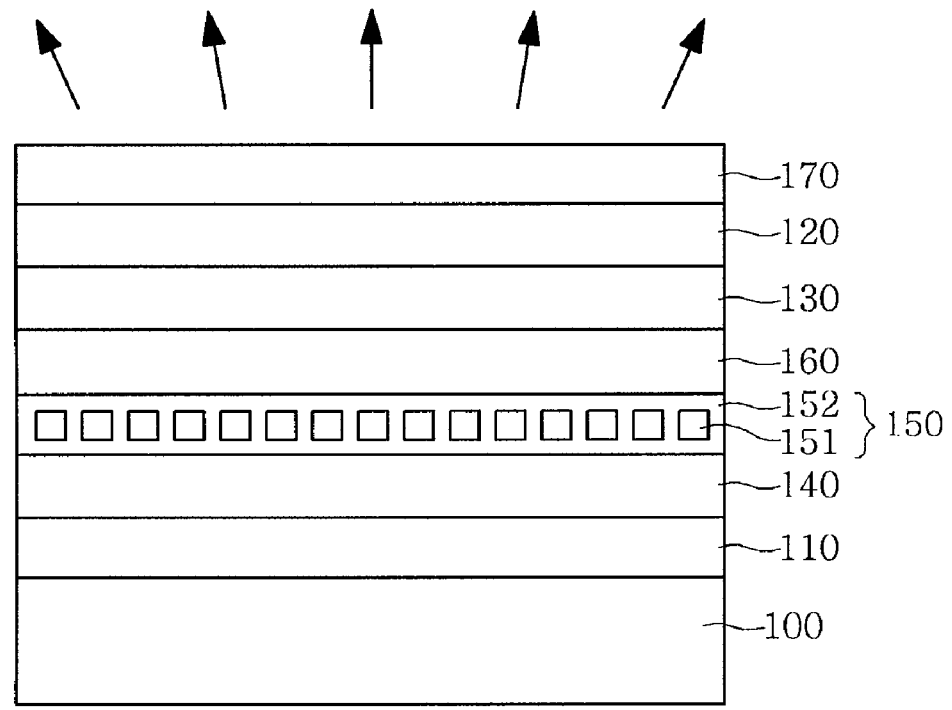
FIG. 2 is a cross-sectional view of a luminescent device in accordance with another exemplary embodiment.

Although the exemplary embodiment of FIG. 1 illustrates the bottom emission type luminescent device, the luminescent device where the organic luminescent layer and the organic layer are stacked may have a top emission type structure. Referring to FIG. 2, the top emission type luminescent device may be manufactured by forming a first organic layer 140, a nanocrystal layer 150 and a second organic layer 160 between a first conductive layer 110 and a second conductive layer 130, and forming an organic luminescent layer 120 between the second conductive layer 130 and a third conductive layer 170. Here, the first and second conductive layers 110 and 130 may be formed of a material with electrical conductivity, for example, Al. The third conductive layer 170 may be formed of a transparent conductive material, for example, a transparent conductive oxide (TCO) such as indium tin oxide (ITO) and indium zinc oxide (IZO). The second conductive layer 130 serves as an electrode for supplying electrons, and the third conductive layer 170 serves as an electrode for supplying holes.

Alternatively, the top emission type luminescent device may be implemented such that the second conductive layer 130 serves as the electrode for supplying holes, and the third conductive layer 170 serves as an electrode for supplying electrons. In this case, the second conductive layer 130 may be formed of a metal with a high work function, for example, gold (Au). Alternatively, the second conductive layer 130 may be formed of a reflective metal and a transparent conductive material with a high work function. The reflective metal may include Al, Al:Nd, Ag or an alloy thereof. The transparent conductive material may include a transparent conductive oxide such as ITO and IZO. A light-transmitting electrode containing a metal having a lower work function than the second conductive layer 130 may be used for the third conductive layer 170. For example, the third conductive layer 170 may be formed of at least one selected from the group consisting of Mg, Mg:Ag, Ca, Ca:Ag, Ag, Al:Ca, Al:Ag, Li:Mg and Li.

The luminescent device having the above-described structure performs a program or erase operation by charging or discharging the nanocrystal layer 150 when a program voltage or an erase voltage is applied to induce a predetermined voltage difference between the first and third conductive layers 110 and 170. When a read voltage is applied after the program operation, charges, i.e., electrons accumulated in the nanocrystal layer 150 are injected into the organic luminescent layer 120, thus allowing light to be emitted from the organic luminescent layer 120. The luminescent device of the exemplary embodiments can rapidly operate at a speed of several tens of nanoseconds, and has bistable conductance and negative differential resistance (NDR) characteristics. The luminescent device of the exemplary embodiments has a variety of current levels depending on the program voltage and the read voltage, which makes it possible to realize a desired gray scale. Hereinafter, characteristics of the luminescent device of the exemplary embodiments will be described in detail.

Figure 3:
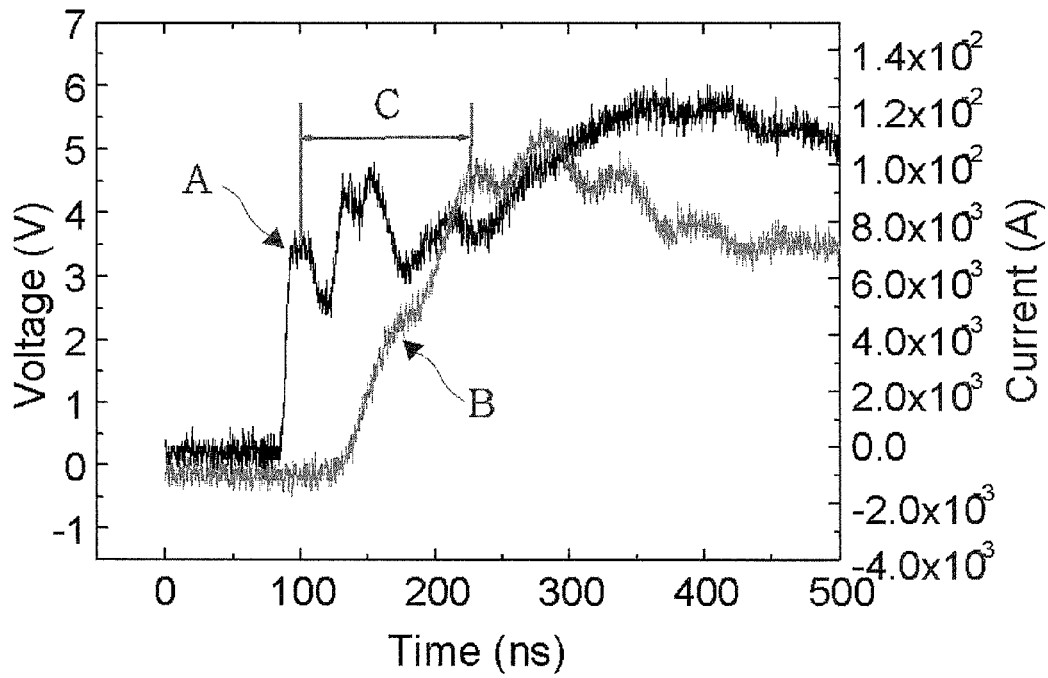
FIG. 3 is a graph illustrating an operating speed of a luminescent device.

FIG. 3 is a graph illustrating an operating speed of a luminescent device in accordance with the exemplary embodiments. Specifically, FIG. 3 is a graph of a current flow time measured after a voltage is applied to the luminescent device.

Referring to FIG. 3, it takes several tens of nanoseconds for a current (B) to starts flowing after a voltage (A) is applied to the luminescent device. Therefore, the program, erase, and read operations can be performed at ultra-high speed of several tens of nanoseconds. Accordingly, the luminescent device can remarkably improve its operating speed in comparison with a related art active matrix organic light emitting diode (AMOLED) of which pixel selection rate is 1/60 second. Further, there is no image sticking so that the display quality can be also enhanced.

Figure 4:
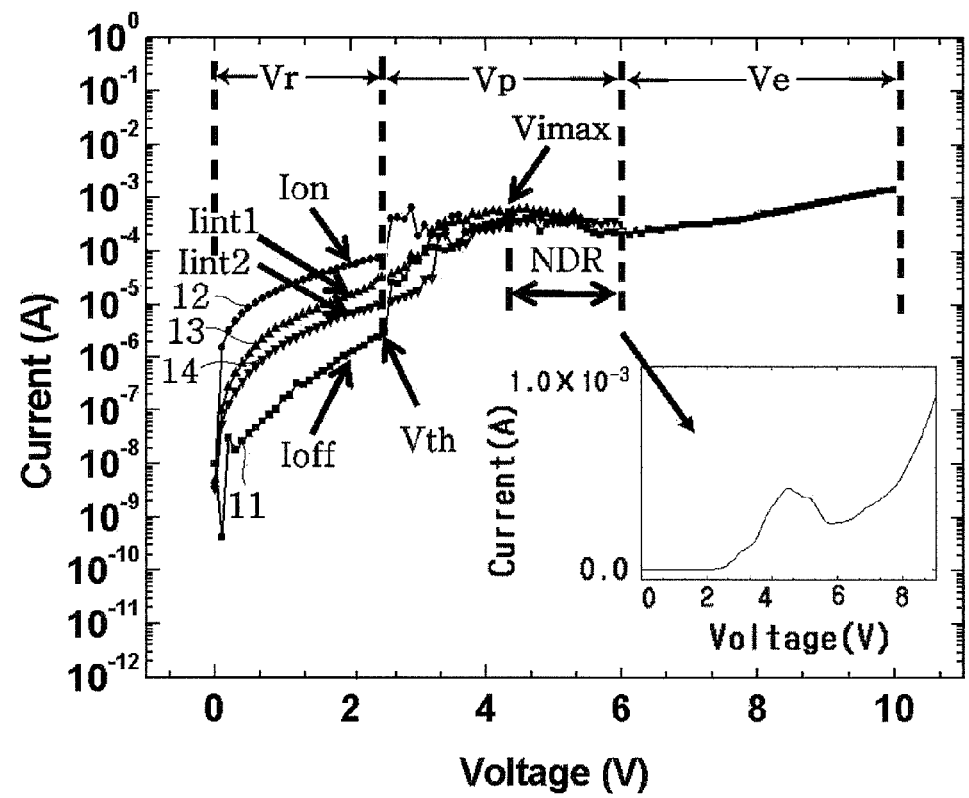
FIGS. 4 and 5 are graphs illustrating current versus voltage characteristics of a luminescent device employing AIDCN depending on a positive voltage and a negative voltage, respectively.
Figure 5:
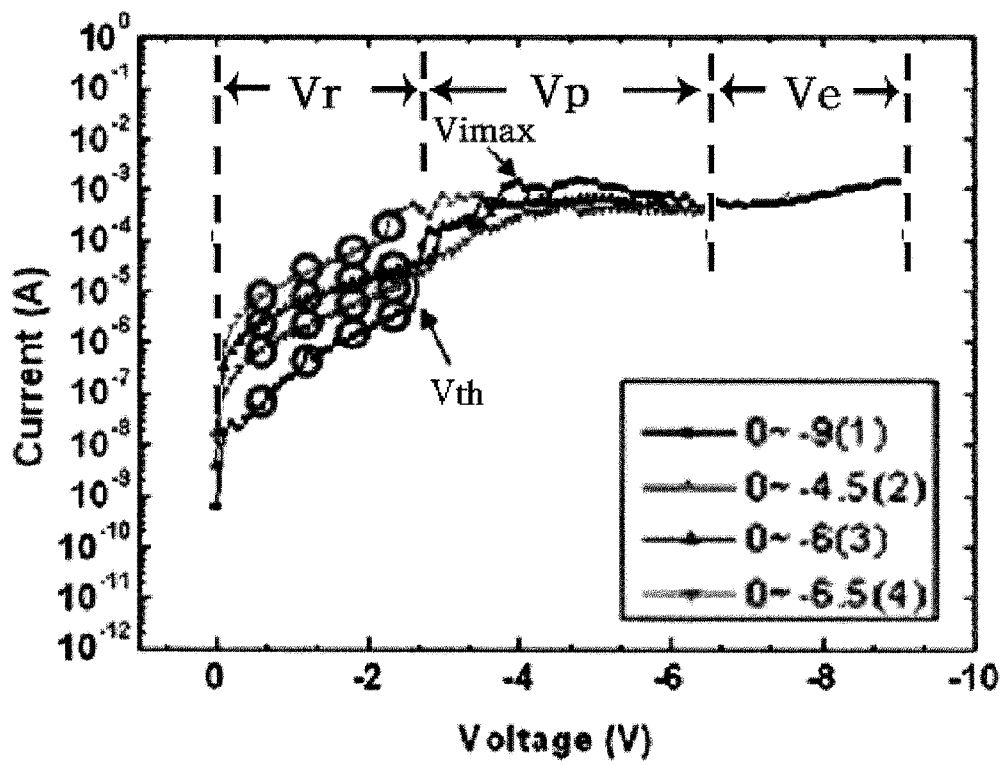
Figure 6:
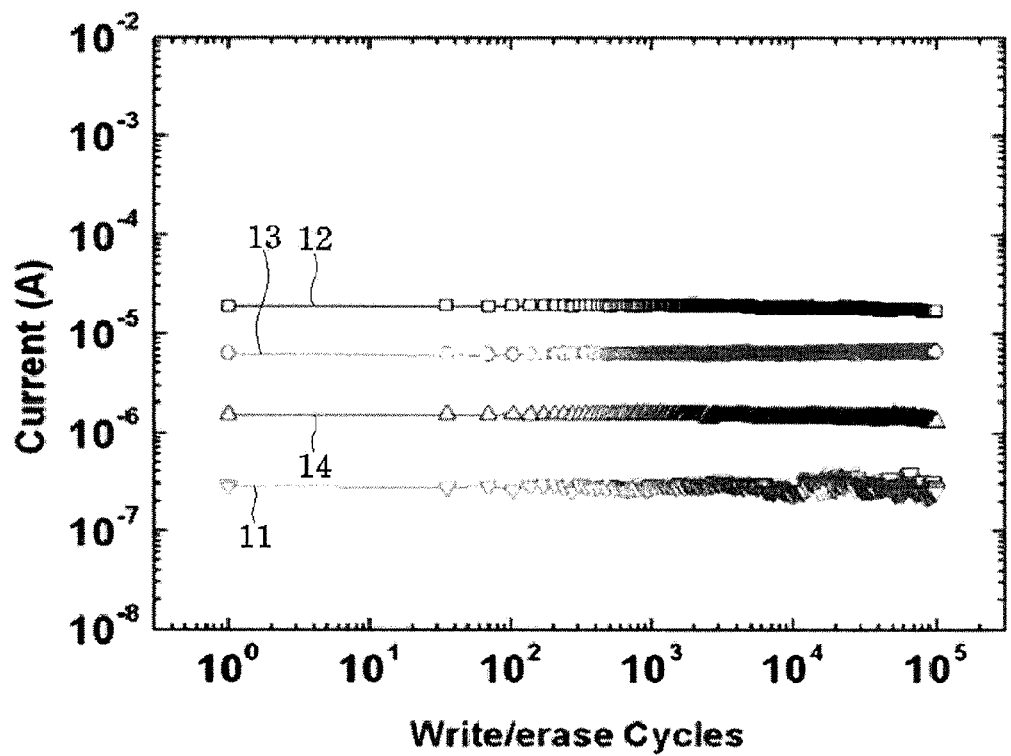
FIG. 6 is a graph illustrating retention characteristics of the luminescent device employing AIDCN.
Figure 7:
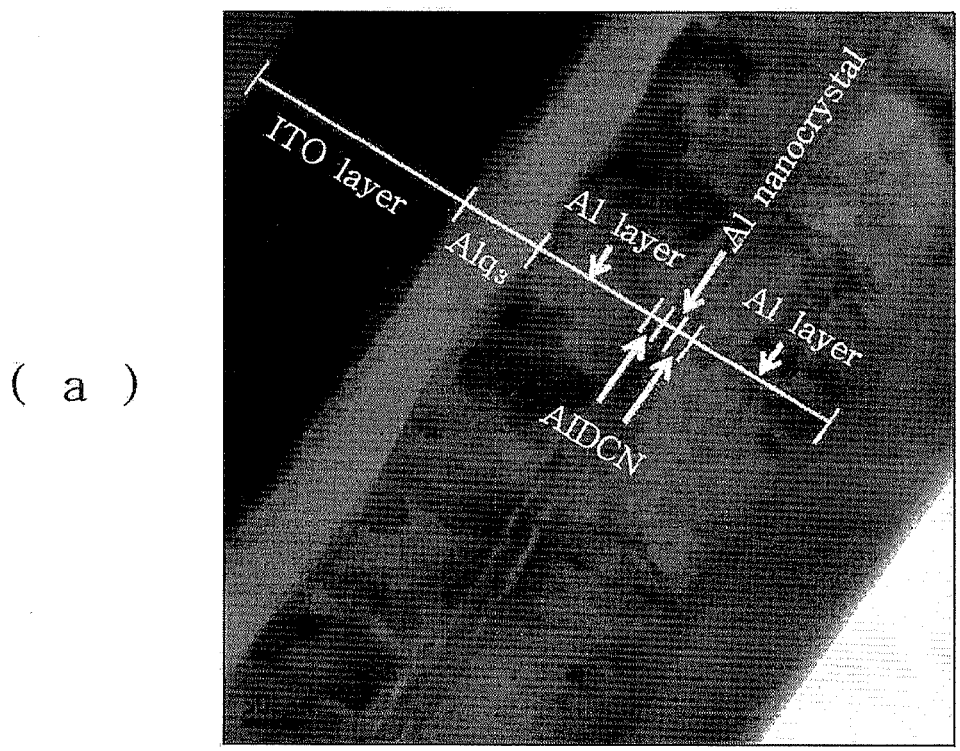
FIG. 7 shows cross sectional views of the luminescent device employing AIDCN.
Figure 7:
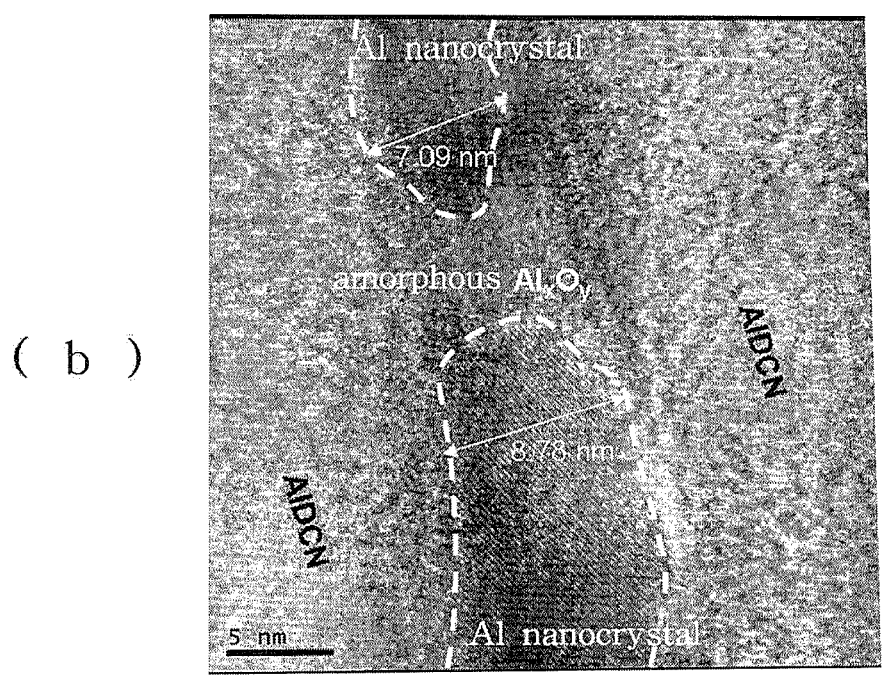

FIG. 4 is a graph of current versus voltage (I-V) characteristics when a voltage is applied to a luminescent device in a forward direction using AIDCN for the first and second organic layers 140 and 160, and FIG. 5 is a graph of current versus voltage (I-V) characteristics when a voltage is applied to the luminescent device in a reverse direction. FIG. 6 is a graph illustrating retention characteristics of the luminescent device. FIGS. 7(a) and (b) are micrographic views of the luminescent device. The luminescent device to be illustrated in FIGS. 4 through 7 has a multi-layered structure including a first conductive layer of a 150 nm-thick ITO layer, a hole injection layer of a 20 nm-thick CuPc layer, a hole transport layer of a 40 nm-thick α-NPD layer, an organic luminescent layer of a 60 nm-thick Alq3 layer, an electron injection layer of a 0.5 nm-thick LiF layer, a second conducive layer of a 80 nm-thick Al layer, a first organic layer of a 30 nm-thick AIDCN layer, a metal layer of a 20 nm-thick Al layer, a second organic layer of a 30 nm-thick AIDCN layer, and a third conductive layer of a 80 nm-thick Al layer.

An oxygen plasma treatment is performed on ITO of the first conductive layer 110 and Al of the nanocrystal layer 150. The oxygen plasma treatment for the first conductive layer 110 is performed for approximately 30 seconds to clean the first conductive layer 110 and reduce a work function, and the oxygen plasma treatment for Al is performed for approximately 300 seconds to form the nanocrystal layer 150.

Referring to FIG. 4, when a predetermined voltage is applied to the first and third conductive layers 110 and 170 of the bottom emission type luminescent device where AIDCN is used for the first and second organic layers 140 and 160 and AL is used in the nanocrystal layer 150, the luminescent device has various current levels within a predetermined voltage range. That is, when an anode is connected to the first conductive layer 110 and a cathode is connected to the third conductive layer 170, and then a voltage is applied to the first and third conductive layers 110 and 170 in a forward direction while increase its voltage level continually, a current increases according to an increase in a voltage until the voltage reaches up to a predetermined level but the current decreases in spite of a voltage increase after the predetermined level. Such a region where the current decreases in spite of a voltage increase is called a negative differential resistance (NDR) region. Beyond the NDR region, the current increases again according as the voltage increases. For example, when the first and third conductive layers 110 and 170 are respectively connected to an anode and a cathode, and a voltage is applied in a forward direction while continually increasing its voltage level up to 10 V (see the plot 11 of FIG. 4), the amount of current flowing through the luminescent device increases from a threshold voltage (Vth) of approximately 3 V. As the applied voltage increases, the current reaches the maximum level at a voltage (Vimax) of approximately 4.5 V. Thereafter, the NDR region appears in a range between approximately 4.5 V to approximately 6 V, during which the current decreases as the voltage increases. When the voltage exceeds the NDR region, the current increases again from approximately 6 V as the voltage increases. Therefore, a voltage at which the current increases again beyond the NDR region, for example, 8 V, is an erase voltage (Ve).

Accordingly, by the use of the current versus voltage characteristics described above, it is possible to set respective voltages required for program, erase and read operations of the luminescent device in accordance with the exemplary embodiment. That is, the program voltage may be selected from a voltage range of the threshold voltage (approximately 3 V) or higher and not greater than the NDR region (approximately 6 V), the erase voltage may be selected from a voltage range beyond the NDR region (approximately 6 V), and the read voltage may be selected from a voltage range below the threshold voltage (approximately 3 V).

Further, in accordance with the exemplary embodiment, a current with different levels flow through the luminescent device during read operation depending on a voltage level of the program voltage.

Figure 14:
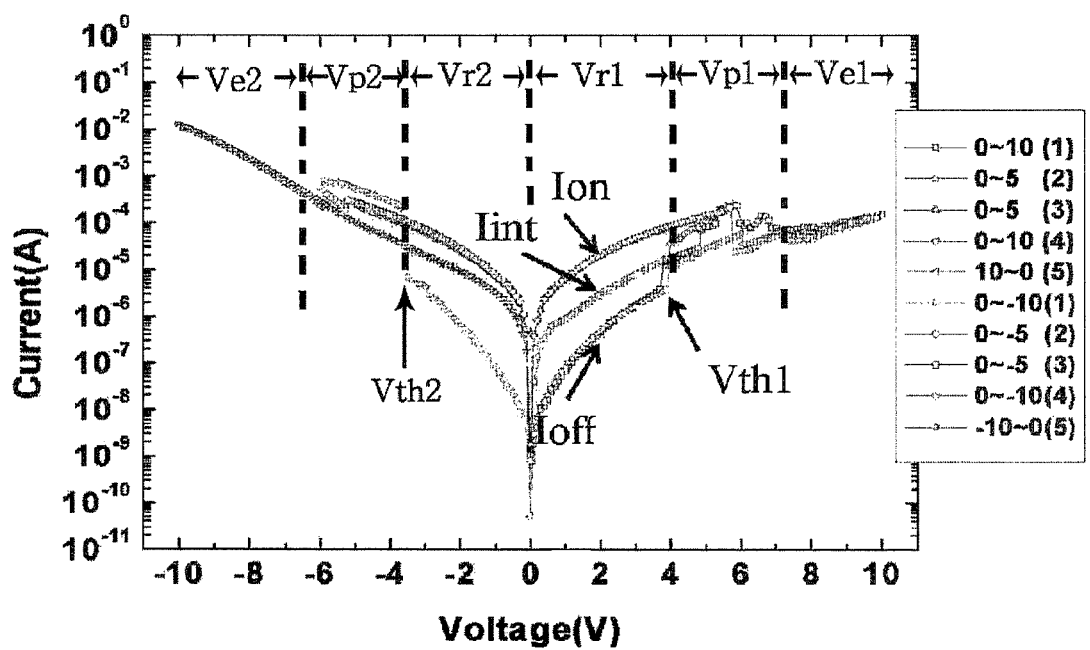
FIG. 14 is a graph illustrating current versus voltage characteristics of the luminescent device employing Alq3 depending on a positive voltage and a negative voltage.

Referring to the plot 12 of FIG. 14, when the luminescent device is programmed by a program voltage (Vp) of 4.5 V and a voltage increased to 4.5 V is then applied again, a current increases than before. Referring to the plots 13 and 14 of FIG. 4, when 5.3 V and 6 V of the NDR region are respectively applied to program the luminescent device and thereafter 5.3 V and 6 V are applied again, the current has an intermediate level higher than the current level of the plot 11 but lower than the current level of the plot 12. That is, it can be appreciated that a current having a level higher than the current level of the plot 11 flows when a read operation is performed after the program operation. The current level of the plot 11 may be equal to a current level when a read operation is performed after the luminescent device is erased.

Why such a phenomenon occurs will be described below. In the luminescent device of the exemplary embodiment, the first and second organic layers 140 and 160 serve as a Schottky barrier, and the barrier layer 155 serves as a tunneling barrier. Therefore, below the threshold voltage, charges are not accumulated in the nanocrystal layer 150 due to a difference in energy level between the nanocrystal layer 150 and the first and second organic layers 140 and 160, so that the amount of current increases minutely. When, however, a voltage applied between the first and third conductive layers 110 and 170 is higher than the threshold voltage (Vth) of the luminescent device of the exemplary embodiment, charges are accumulated in the nanocrystal layer 150 so that the amount of current increases sharply. Thereafter, the amount of current in the case where the charges are accumulated in the nanocrystal layer 150 is several tens to several hundreds of times the amount of current in the case where the charges are not accumulated. When the voltage applied between the first and third conductive layers 110 and 170 has a voltage level in the NDR region, the amount of current is lower than that of the case where charges are partially charged or discharged in the nanocrystal layer 150 (i.e., the case of applying Vimax voltage) but higher than that of the case where charges are not accumulated (i.e. the case of applying the erase voltage). When a voltage higher exceeding the NDR region, i.e., erase voltage, is applied, the charges accumulated in the nanocrystal layer 150 are discharged so that the luminescent device changes to an uncharged state.

In other words, when the voltage applied to the first and third conductive layers 110 and 170 is higher than the threshold voltage, charges are accumulated in the nanocrystal layer 150. This is because the charges are tunneled through the barrier layer and trapped in the nanocrystal layer 150. Beyond the threshold voltage, therefore, a current increases sharply. Afterwards, when the voltage continually increases to enter the NDR region, the charges are partially charged/discharged in the nanocrystal 150. NDR phenomenon occurs due to the electric field effect and partial charging/discharging of the charges trapped in the nanocrystal layer 150 so that the amount of current decreases although the applied voltage increases. When the voltage further increases continually, the erase phenomenon occurs so that the charges are not trapped in the nanocrystal layer 150 and further the charges trapped in the nanocrystal layer 150 are tunneled through the barrier layer to move into the organic layer. Accordingly, the charges trapped in the nanocrystal layer are removed at near the erase voltage, and the current increase as the voltage increases.

When a high program voltage selected from the NDR region of FIG. 4 is applied, the nanocrystal layer has a high resistance. This is because a current of the nanocrystal layer is reduced compared to the case where a relatively low program voltage selected from the NDR region is applied. That is, from Ohm's law, i.e., R=V/I, a current has a low level with respect to a high voltage in the NDR region. Therefore, the application of high program voltage causes the resistance of the nanocrystal layer to be decreased.

When a read voltage is applied after the high program voltage is applied, the nanocrystal layer has a low current level at the read voltage due to its high resistance. On the contrary, when the read voltage is applied after the low program voltage is applied, the nanocrystal layer has a high current level at the read voltage due to a relatively low resistance.

As described above, a current flowing through the luminescent device is set differently depending on a level of the program voltage. Accordingly, a driving current required for light-emitting operation may be differently set depending on the applied program voltage.

As such, since the NDR region exists in the luminescent device of the exemplary embodiment, it is possible to apply a voltage (i.e., program voltage) with a plurality of levels used to accumulate charges in the nanocrystal layer 150. As the program voltages with the plurality of levels are applied, it is possible to realize a plurality of current levels, e.g., four current levels. Furthermore, a current with different levels may flow depending on the read voltage in the luminescent device of the exemplary embodiment. Consequently, compared to the related art luminescent device where 256 gray scale levels are realized using only one current level, the luminescent device of the exemplary embodiment realizes 256 gray scale levels using four current levels because 64 gray scale levels can be realized through one current level, making it possible to achieve a gray scale effectively. Here, the applied program voltage may be selected from a range of the threshold voltage or higher and not greater than a voltage of the NDR region. Since a slope of a current-voltage curve is steep in a range between the threshold voltage and the voltage Vimax, however, gentle in the NDR region, the program voltage may be selected from the NDR region to express accurate gradation.

Referring again to FIG. 4, it can be observed that there are four current levels at 2 V. That is, an on-current (Ion) with a high current level (i.e., low resistance) appears at the read voltage (Vr) after the program voltage of 4.5 V is applied; intermediate currents (Iint1 and Iint2) with intermediate current levels (i.e., intermediate resistance) appear at the read voltage (Vr) after the program voltages of 5.3 V and 6 V in the NDR region are applied; and an off-current (Ioff) with a low current level (i.e., high resistance) appears at the read voltage (Vr) after an erase voltage (Ve) is applied. A ratio (Ion/Ioff) of the on-current (Ion) with high level to the off-current (Ioff) with low level (hereinafter, referred to as on/off current ratio in brief) is approximately $1.2 \times 10^2$, and a current difference between the on-current (Ion) and the off-current (Ioff) is approximately $10^2$ at the read voltage of 2 V. Hence, if AIDCN is used for the first and second organic layers 140 and 160, operation of the luminescent device can be variously controlled using the program voltage (Vp) in the range of 3 V to 6 V, the erase voltage (Ye) of 8 V, and the read voltage (Vr) of 2 V. The NDR region exists between the threshold voltage and the erase voltage, a program voltage with a plurality of levels can be applied, which makes it possible to obtain a plurality of current levels in a read operation. Therefore, a multi-state gray scale can be easily realized using the plurality of current levels. For example, since a four-state gray scale can be realized when the on/off current ratio (Ion/Ioff) is approximately $1.2 \times 10^2$ 8, 16 or 256 gray scale levels can be achieved by adjusting the on/off current ratio (Ion/Ioff). In the related art luminescent device, however, there is only one current level, and thus a voltage should be divided into 64 levels in order to achieve 64 gray scale levels using the one current level. Furthermore, if a divisible voltage level is small in the related art luminescent device, there is a limitation in realizing a gray scale. In contrast, the luminescent device of the exemplary embodiment has a variety of current levels depending on a program voltage and a read voltage, and thus 256 gray scale levels can be easily realized using the variety of current levels.

FIG. 5 is a graph of current versus voltage (I-V) characteristics when a voltage is applied to a luminescent device in a reverse direction. Referring to FIG. 5, if a voltage is successively increased in a reverse direction, a current increases up to a voltage with a predetermined level, then an NDR region appears in which a current decreases as a voltage increases, and subsequently a current increases again as a voltage increases. This is attributed to a symmetrical structure of a device, and therefore, the aforesaid mechanism of the case where the voltage is applied in the forward direction is also applicable to the case where the voltage is applied in the reverse direction.

By the use of this principle, the luminescent device of the exemplary embodiment performs program and erase operations by charging and discharging the nanocrystal layer 150 through application of a program voltage and an erase voltage, and also emits light using charges accumulated in the nanocrystal layer 150 through application of a read voltage. Accordingly, it is possible to perform main operations of a typical nonvolatile memory device, for example, program operation, read operation and erase operation. That is, when a program voltage is applied to the luminescent device, charges are accumulated in the nanocrystal layer 150 so that data '1' of logic HIGH is stored. On the contrary, when an erase voltage is applied to the luminescent device, charges are discharged from the nanocrystal layer 150 so that data is erased to '0', i.e., logic LOW. When an intermediate program voltage, i.e., a voltage of the NDR region, is applied to the luminescent device, charges are partially accumulated in the nanocrystal layer 150 so that data having an intermediate logic level between logic HIGH and logic LOW is programmed to the luminescent device. When a read voltage is applied to the luminescent device, the amount of current flowing through the nanocrystal layer 150 is greatly varied according to whether the charges are accumulated in the nanocrystal layer 150. Resultingly, this current allows the organic luminescent layer 120 to emit light. Herein, the above-described logic levels may be changed depending on a measured current direction.

FIG. 6 is a graph illustrating current versus program/erase cycle when AIDCN is used for the first and second organic layers 140 and 160. Referring to FIG. 6, in the case (see the plot 11) where a read voltage of 2 V is applied after an erase voltage of 10 V is applied, in the case (see the plot 12) where the read voltage of 2 V is applied after a first program voltage of 4.5 V is applied, in the case (see the plot 13) where a read voltage of 2 V is applied after a second program voltage of 5.3 V is applied, and in the case (see the plot 14) where the read voltage of 2 V is applied after a third program voltage of 6 V is applied, constant current levels and four current states are maintained even if the program/erase cycle is increased. Thus, it is possible to realize four gray scales.

Referring to FIG. 7(*a*), it can be observed that a first conductive layer, an organic luminescent layer, a second conductive layer, a first organic layer, a nanocrystal layer, a second organic layer and a third conductive layer are distinctly formed. Referring to FIG. 7(*b*), it can be observed that a nanocrystal layer including Al nanocrystals and a barrier layer of an amorphous AlxOy surrounding the Al nanocrystals is formed between first and second organic layers. Herein, it can be also observed that the plurality of Al nanocrystals are surrounded by the barrier layer so that they are sufficiently isolated from each other.

Figure 8:
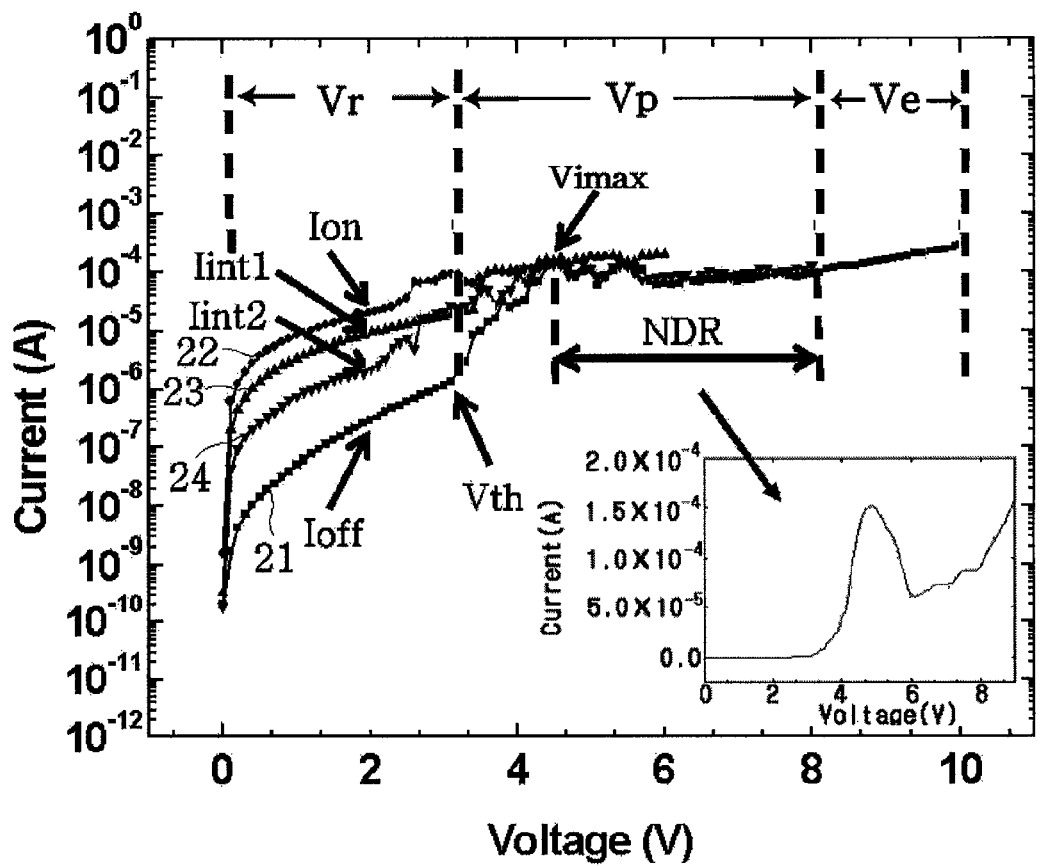
FIG. 8 is a graph illustrating current versus voltage characteristics of a luminescent device employing α-NPD.
Figure 9:
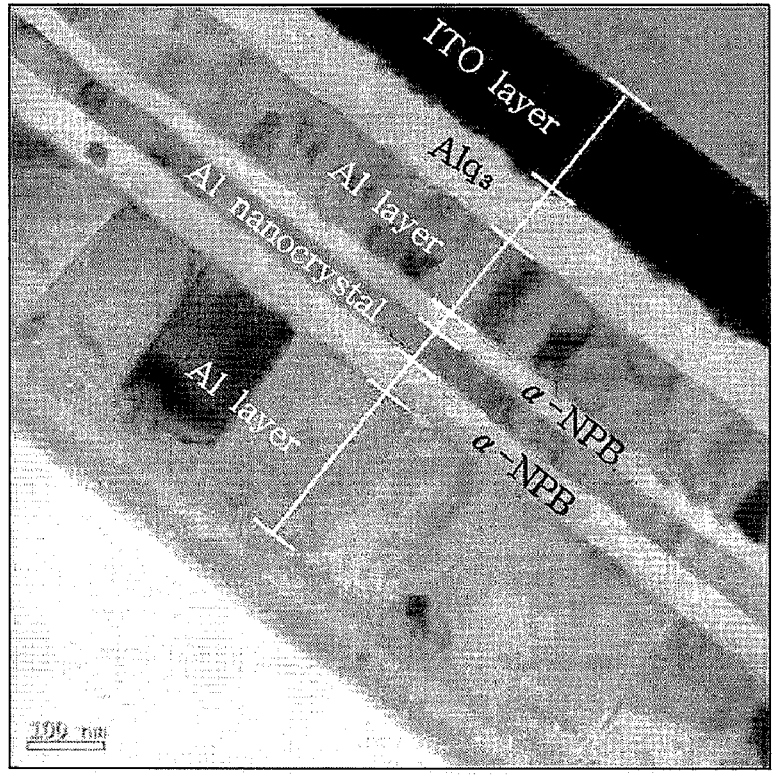
FIG. 9 are cross sectional views of the luminescent device employing α-NPD.
Figure 9:
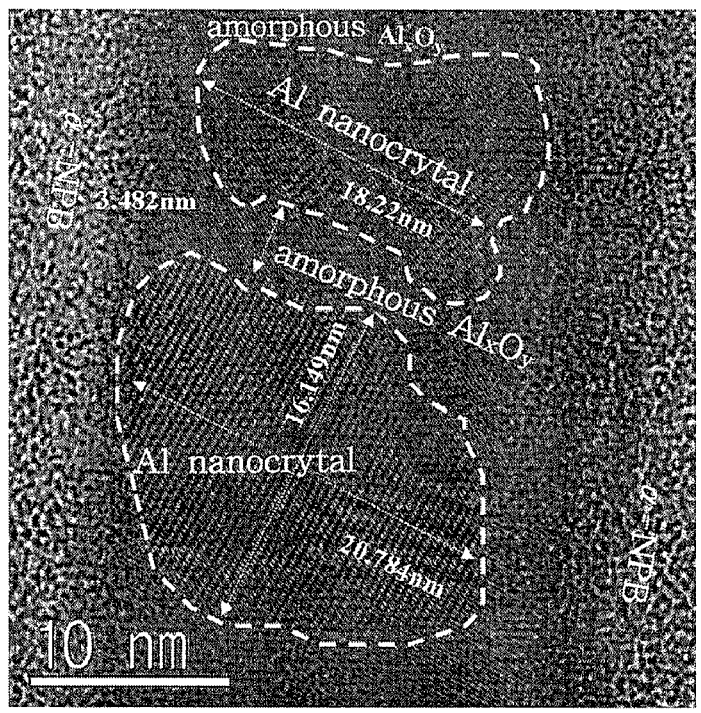

FIG. 8 is a graph illustrating current versus voltage (I-V) characteristics of a luminescent device where α-NPD is used for the first and second organic layers 140 and 160. FIG. 9 is a micrographic view of the luminescent device where α-NPD is used for the first and second organic layers 140 and 160.

In this exemplary embodiment, the luminescent device has a multi-layered structure including a first conductive layer of a 150 nm-thick ITO layer, a hole injection layer of a 20 nm-thick CuPc layer, a hole transport layer of a 40 nm-thick α-NPD layer, an organic luminescent layer of a 60 nm-thick Alq3 layer, an electron injection layer of a 0.5 nm-thick LiF layer, a second conducive layer of a 80 nm-thick Al layer, a first organic layer of a 30 nm-thick α-NPD layer, a metal layer of a 10 nm-thick Al layer, a second organic layer of a 30 nm-thick α-NPD layer, and a third conductive layer of a 80 nm-thick Al layer. An oxygen plasma treatment is performed on ITO of the first conductive layer 110 and Al of the nanocrystal layer 150. The oxygen plasma treatment for the first conductive layer 110 is performed for approximately 30 seconds to clean the first conductive layer 110 and reduce a work function, and the oxygen plasma treatment for Al is performed for approximately 300 seconds so as to form the nanocrystal layer 150.

Referring to FIG. 8, when the first and third conductive layers 110 and 170 are respectively connected to an anode and cathode, and a voltage is applied while successively increasing its voltage level up to 10 V (see the plot 21), the amount of current is sharply increased beyond the threshold voltage of approximately 3.6 V, a current is maximized at a voltage Vimax of approximately 4.5 V, then the current is slowly decreased in a range of approximately 4.5 V to approximately 8 V, and the current is increased again over approximately 8 V. Here, 4.5 V at which the current is maximum is selected as a first program voltage, 6 V and 8 V of the NDR region are respectively selected as a second program voltage and a third program voltage, and 10 V is selected as an erase voltage (Ye) from a region where the current is increased again beyond the NDR region. When the first program voltage is applied to the luminescent device and a voltage increased to 4.5 V is then applied again, the amount of current increases (see the plot 22). When 6 V and 8 V are applied as the second and third program voltages, respectively, (see the plots 23 and 24), the current has an intermediate level between the current level of the plot 21 and the current level of the plot 22.

From FIG. 8, it can be appreciated that four current states are measured at 2 V. An on/off current ratio (Ion/Ioff) of an on-current (Ion) with high level to an off-current (Ioff) with low level is approximately 1.64×102, and a current difference between the on-current (Ion) and the off-current (Ioff) is approximately 102 at the read voltage of 2 V. Hence, when α-NPD is used for the first and second organic layers 140 and 160, operation of the luminescent device can be controlled using the program voltages (Vp) of 4.5 V, 6 V and 8 V, the erase voltage (Ve) of 10 V, and the read voltage (Vr) of 2 V. That is, since the NDR region exists between the threshold voltage and the erase voltage, a multi-state gray scale can be easily realized. Referring to FIG. 9(*a*), it can be observed that a first conductive layer, an organic luminescent layer, a second conductive layer, a first organic layer, a nanocrystal layer, a second organic layer and a third conductive layer are distinctly formed. Referring to FIG. 9(*b*), it can be observed that a nanocrystal layer is provided with a nanocrystal and a barrier layer. Therefore, the plurality of nanocrystals are surrounded by the barrier layer so that they are sufficiently isolated from each other.

Figure 10:
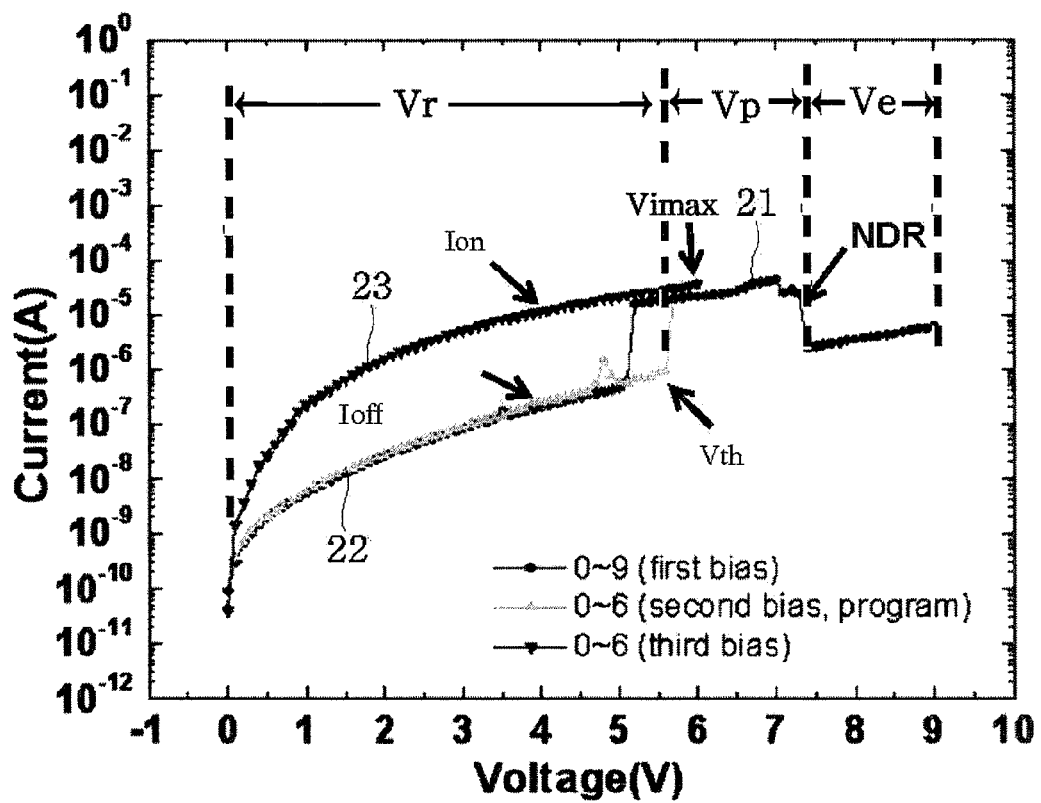
FIG. 10 is a graph of current versus voltage illustrating luminescent properties of the luminescent device employing α-NPD.
Figure 11:
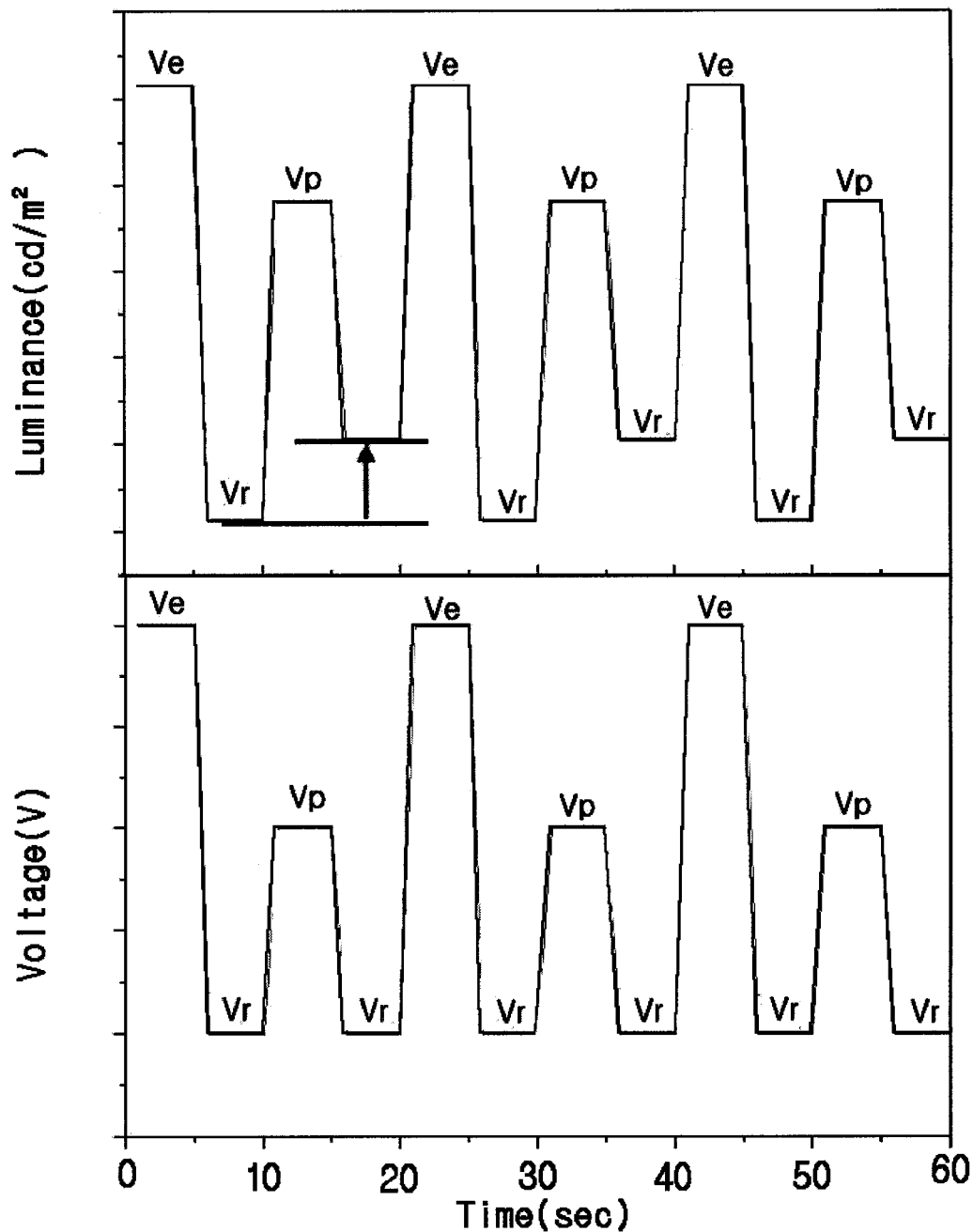
FIGS. 11 and 12 are a graph and an image illustrating luminescent states of the luminescent device employing α-NPD.
Figure 12:
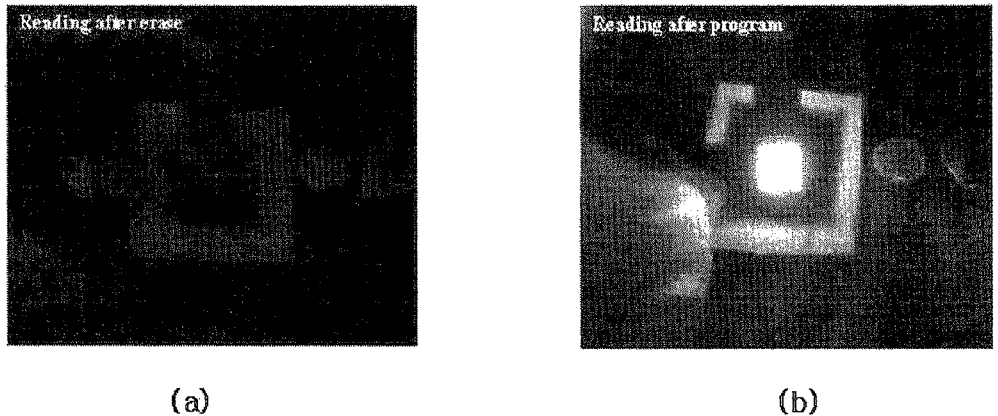

FIG. 10 is a graph of current versus voltage illustrating luminescent properties of the luminescent device where α-NPD is used for the first and second organic layers 140 and 160. FIGS. 11 and 12 are a graph and an optical image illustrating luminescent states of the case where a read voltage is applied after a program voltage is applied and the case where a read voltage is applied after an erase voltage is applied.

Referring to FIG. 10, when a voltage is applied in a forward direction while increasing its voltage level from 0 V to 10 V (see the plot 21), a current slowly increases as a voltage increases, and then sharply increases at the threshold voltage (Vth) of approximately 5 V. Thereafter, a current slowly increases as a voltage increases, then an NDR region appears at approximately 7 V where a current decreases sharply, and a current increases again beyond the NDR region. Here, a program voltage is 6 V, an erase voltage is 8 V, and a read voltage is 4 V. When the program voltage of 6 V is applied in a forward direction, the device is programmed (see the plot 22). When a voltage increased to the program voltage of 6 V is applied again (see plot 23), the amount of current increases. Referring to FIGS. 11 and 12, there are shown the luminescent state of the case where the read voltage is applied after the erase voltage is applied, and the luminescent state of the case where the read voltage is applied after the program voltage is applied. As illustrate in FIG. 11, even though the same read voltage (Vr) is applied, it can be observed that luminescent brightness by the read voltage (Vr) is very low in the case where the read voltage (Vr) is applied after the erase voltage (Ve) is applied, whereas light with sufficient brightness is emitted in the case where the read voltage (Vr) is applied after the program voltage (Vp) is applied. That is, as illustrated in FIG. 12, light is not emitted when the read voltage is applied after the read voltage is applied, however, light is emitted when the read voltage is applied after the program voltage is applied.

Figure 13:
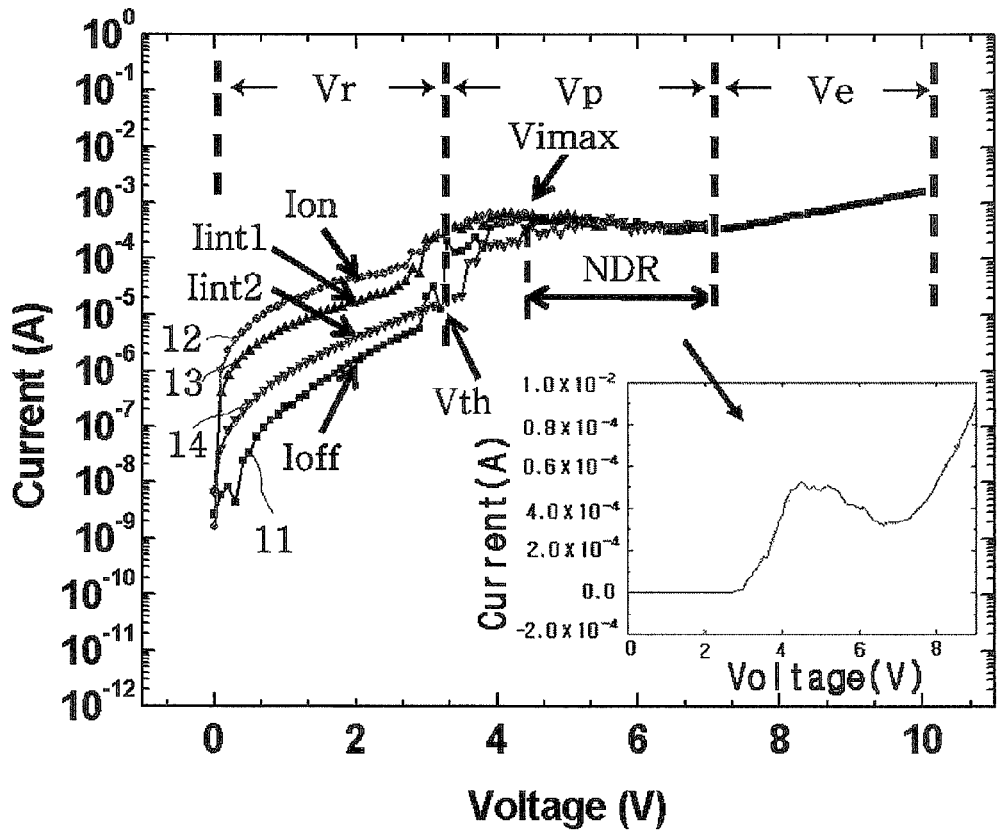
FIG. 13 is a graph illustrating current versus voltage characteristics of a luminescent device employing hydroxyquinoline aluminum (Alq3)

FIG. 13 is a graph illustrating current versus voltage (I-V) characteristics of a luminescent device where Alq3 is used for the first and second organic layers 140 and 160. In this exemplary embodiment, the luminescent device has a multi-layered structure including a first conductive layer of a 150 nm-thick ITO layer, a hole injection layer of a 20 nm-thick CuPc layer, a hole transport layer of a 40 nm-thick α-NPD layer, an organic luminescent layer of a 60 nm-thick Alq3 layer, an electron injection layer of a 0.5 nm-thick LiF layer, a second conducive layer of a 80 nm-thick Al layer, a first organic layer of a 30 nm-thick Alq3 layer, a metal layer of a 10 nm-thick Al layer, a second organic layer of a 30 nm-thick Alq3 layer, and a third conductive layer of a 80 nm-thick Al layer. An oxygen plasma treatment is performed on ITO of the first conductive layer 110 and Al of the nanocrystal layer 150. The oxygen plasma treatment for the first conductive layer 110 is performed for approximately 30 seconds to clean the first conductive layer 110 and reduce a work function, and the oxygen plasma treatment for Al is performed for approximately 300 seconds to form the nanocrystal layer 150.

Referring to FIG. 13, when the first and third conductive layers 110 and 170 are respectively connected to an anode and cathode, and a voltage is applied in a forward direction while successively increasing its voltage level up to 10 V (see the plot 31), the amount of current is sharply increased beyond the threshold voltage of approximately 3.3 V, a current is maximized at a voltage Vimax of 4.4 V, then the current is slowly decreased in a range of approximately 4.4 V to approximately 7 V, and the current is increased again over approximately 7 V. Here, 4.4 V at which the current is maximum is selected as a first program voltage, 5.5 V and 7 V of the NDR region are selected as a second program voltage and a third program voltage, respectively, and 10 V is selected as an erase voltage from a region where the current is increased again over the NDR region. When the first program voltage is applied to the luminescent device and then a voltage increased up to 4.4 V is applied again, the amount of current increases (see the plot 32). When 5.5 V and 7 V in the NDR region are applied as the second and third program voltages, respectively, and then voltages increased up to 5.5 V and 7 V are applied again (see the plots 33 and 34), the current has an intermediate level between the current level of the plot 31 and the current level of the plot 32.

From FIG. 13, it can be appreciated that there are four current states at 2 V. An on/off current ratio (Ion/Ioff) of an on-current (Ion) with high level to an off-current (Ioff) with low level is approximately $7.6 \times 10^2$, and a current difference between the on-current (Ion) and the off-current (Ioff) is approximately $10^2$ at the read voltage of 2 V. Hence, when Alq3 is used for the first and second organic layers 140 and 160, operation of the luminescent device can be controlled using the program voltages (Vp) of 4.4 V, 5.5 V and 7 V, the erase voltage (Ve) of 10 V, and the read voltage (Vr) of 2 V. That is, since the NDR region exists between the threshold voltage and the erase voltage, a multi-state gray scale can be easily realized.

Figure 15:
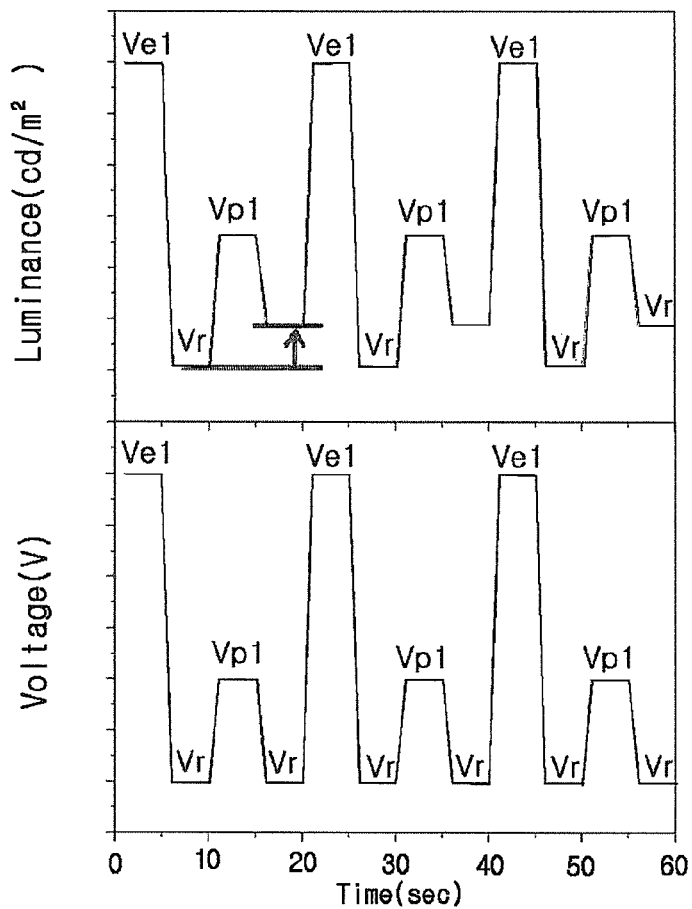
FIGS. 15 and 16 are a graph and an image illustrating luminescent states of the luminescent device employing Alq3.
Figure 16:
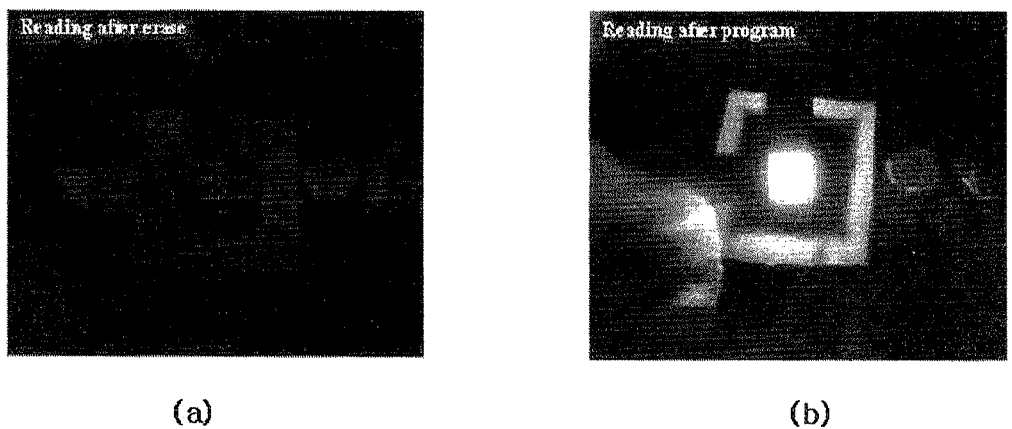

FIG. 14 is a graph of current versus voltage illustrating luminescent properties when Alq3 is used for the first and second organic layers 140 and 160. FIGS. 15 and 16 are a graph and an optical image illustrating luminescent states of the case where the read voltage is applied after the erase voltage is applied, and the case where the read voltage is applied after the program voltage is applied.

Referring to FIG. 14, when a voltage is applied in a forward direction while increasing its voltage level from 0 V to 10 V, a current slowly increases as a voltage increases, and then sharply increases at the threshold voltage (Vth1) of approximately 4 V. Thereafter, a current slowly increases as a voltage increases, and the current has the maximum level at approximately 5 V. Thereafter, an NDR region appears at approximately 6 V where a current decreases sharply, and a current increases again after the NDR region. Here, a program voltage (Vp1) is 5 V, an erase voltage (Ve1) is 9 V, and a read voltage (Vr) is 2 V. When the device is programmed by 5 V and then a voltage increased to 5 V is applied in a forward direction, the amount of current increases than before.

Likewise, when a voltage is applied in a reverse direction while increasing its voltage level from 0 V to −10 V, a current sharply increases at the threshold voltage (Vth2) of approximately −4 V. Thereafter, a current slowly increases as a voltage increases, and the current has the maximum level at approximately −5 V. Thereafter, an NDR region appears at approximately −6 V where a current decreases sharply, and a current increases again beyond the NDR region. Here, a program voltage (Vp2) is −5 V, an erase voltage (Ve1) is −10 V, and a read voltage (Vr) is 4 V.

Referring to FIGS. 15 and 16, there are shown the luminescent state of the case where the read voltage (Vr) is applied after the erase voltage (Ve1) is applied, and the luminescent state of the case where the read voltage (Vr) is applied after the program voltage (Vp1) is applied. As illustrate in FIG. 16, it can be observed that the luminescent device emits light in the case where the read voltage is applied after the erase voltage is applied, whereas the luminescent device does not emit light in the case where the read voltage is applied after the program voltage is applied.

Hereinafter, a method of manufacturing the luminescent device will be described in detail.

FIGS. 17 through 20 are cross-sectional views illustrating a method of manufacturing a luminescent device in accordance with a first exemplary embodiment. Specifically, a nanocrystal layer is formed through oxidation process in this method of FIGS. 17 through 20.

Figure 17:
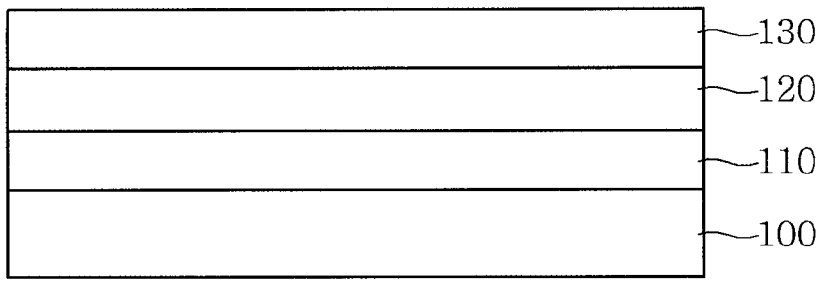
FIGS. 17 through 20 are cross-sectional views illustrating a method of manufacturing a luminescent device in accordance with a first exemplary embodiment.

Referring to FIG. 17, a first conductive layer 110 is formed on a substrate 100. Herein, the substrate 100 may be formed using a transparent substrate, for example, a transparent conductive substrate or a glass substrate. If the transparent conductive substrate is used as the substrate 100, an insulation layer should be formed on the transparent conductive substrate. The insulation layer is formed of an oxide- or nitride-based material. The first conductive layer 110 may be formed of a conductive metal or an oxide thereof, which allows holes to be injected easily. For instance, the first conductive layer 110 may be formed of indium tin oxide (ITO), indium zinc oxide (IZO), gold (Au), silver (Ag), platinum (Pt), etc. The first conductive layer 110 is formed to a thickness ranging from approximately 100 nm to approximately 200 nm. Particularly, the first conductive layer 110 may be formed to approximately 150 nm thick. Thereafter, the substrate 100 where the first conductive layer 110 is formed is cleaned, and then UV and ozone treatment may be performed. The cleaning process may be performed using an organic solvent such as isopropanol (IPA) and acetone. A plasma treatment may be performed on the cleaned ITO substrate.

A hole injection layer (not shown), a hole transport layer (not shown), an organic luminescent layer 120 and an electron injection layer (not shown) are sequentially formed over the substrate 100 where the first conductive layer 110 is formed. The hole injection layer may be formed through vacuum thermal evaporation or spin-coating technique using CuPc or starburst type amines such as TCTA and m-MTDATA. The hole transport layer may be formed through vacuum thermal evaporation or spin-coating technique using α-NPD. The organic luminescent layer 120 may also be formed through vacuum thermal evaporation or spin-coating technique using a high-molecular material or a low-molecular material. The electron injection layer may also be formed through vacuum thermal evaporation or spin-coating technique using LiF, NaCl, CsF, Li2O, BaO, Liq, or the like. The hole injection layer, the hole transport layer, the organic luminescent layer 120 and the electron injection layer are respectively formed in a thickness range of approximately 10 nm to approximately 30 nm, a thickness range of approximately 10 nm to approximately 80 nm, a thickness range of approximately 10 nm to approximately 100 nm, and a thickness range of approximately 0.1 nm to approximately 1 nm. Desirably, the hole injection layer, the hole transport layer, the organic luminescent layer 120 and the electron injection layer may be formed to a thickness of 20 nm, 40 nm, 60 nm, and 0.5 nm, respectively.

A second conductive layer 130 is formed on the first organic layer 120. The second conductive layer 130 may be formed using vacuum thermal evaporation. The second conductive layer 130 may be formed of Al to a thickness ranging from approximately 20 nm to approximately 150 nm.

Figure 18:
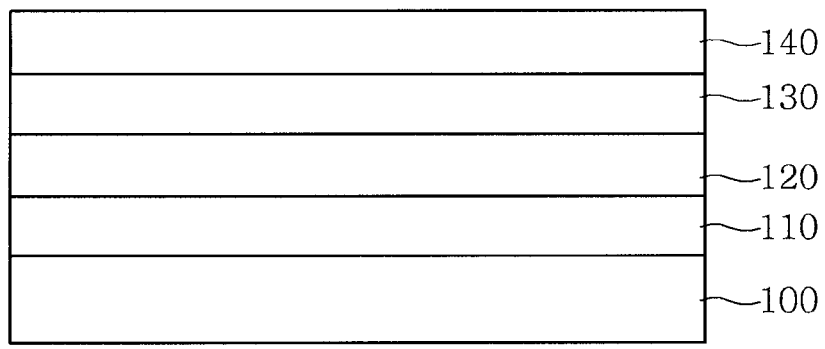

Referring to FIG. 18, a first organic layer 140 is formed on the second conductive layer 130. The first organic layer 140 is formed by evaporating an organic material under conditions that a pressure inside a chamber is in the range of approximately 10-6 Pa to approximately 10-3 Pa, a deposition rate is maintained at approximately 0.2 Å/s to approximately 2 Å/s, and a temperature is in the range of approximately 150° C. to approximately 400° C. The first organic layer 140 may be formed using AIDCN to a thickness ranging from approximately 20 nm to approximately 150 nm.

Figure 19:
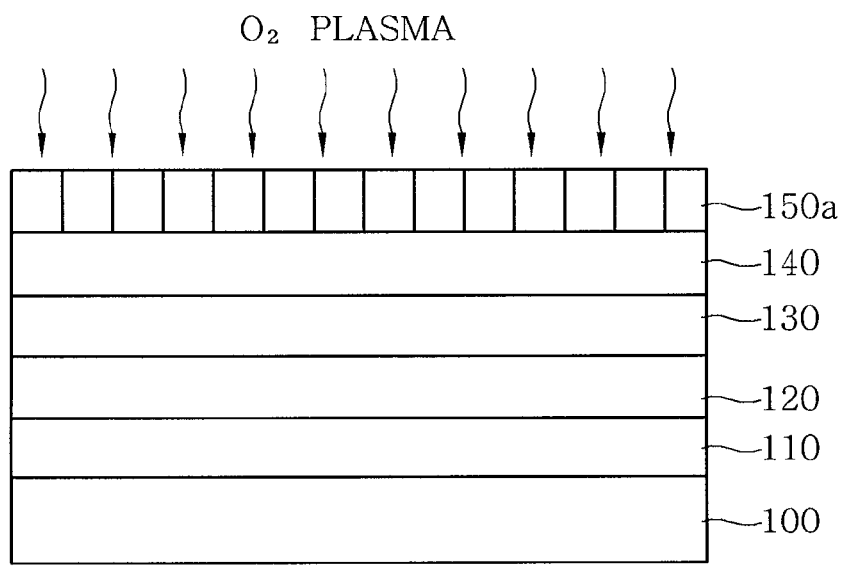
Figure 21:
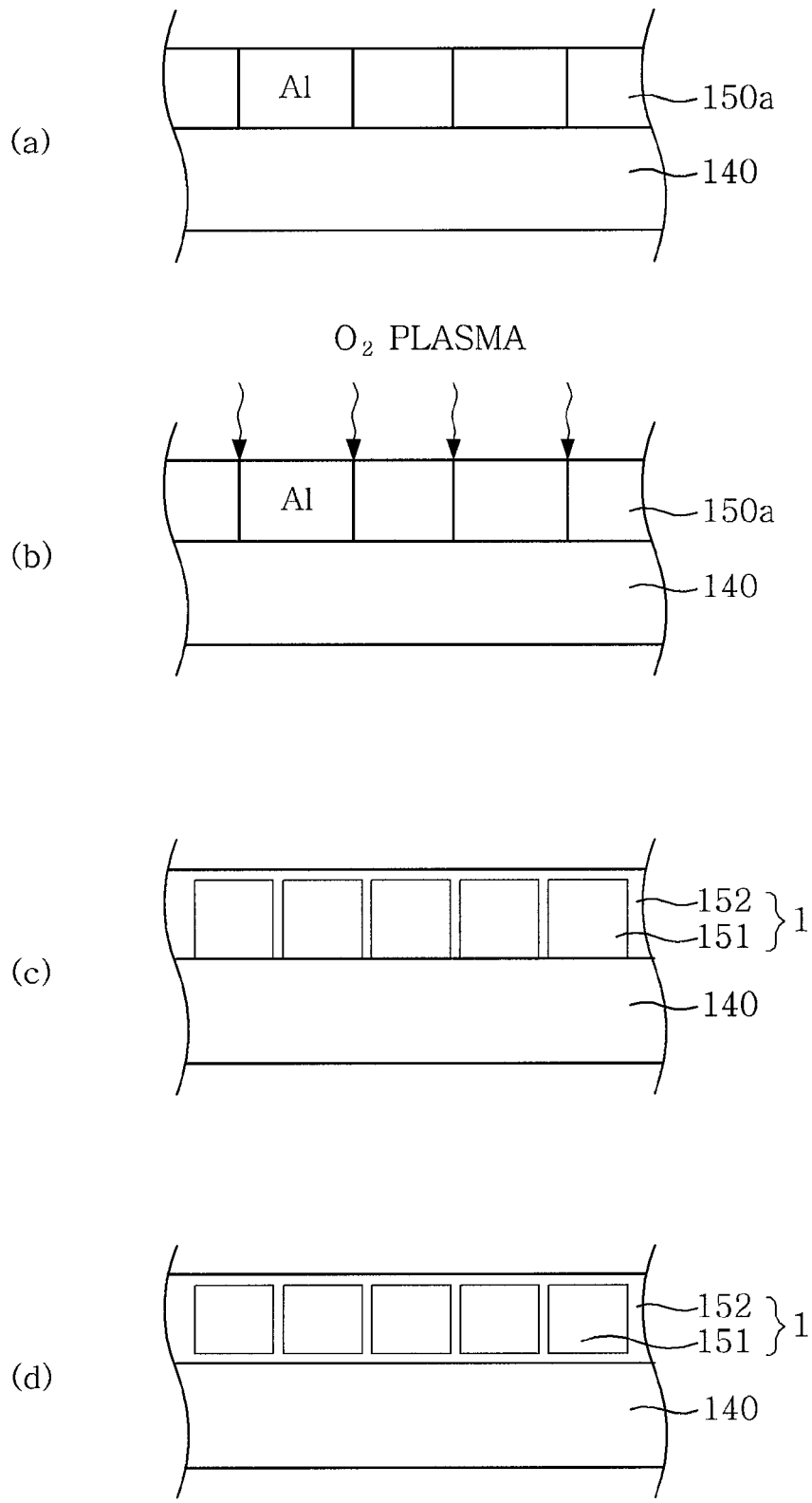
FIG. 21 is a cross sectional views illustrating a method of forming a nanocrystal layer in the method of manufacturing the luminescent device in accordance with the first exemplary embodiment of FIGS. 17 through 20.

Referring to FIGS. 19 and 21, a nanocrystal layer 150 is formed on the first organic layer 140. In order for the nanocrystal layer 150 to have a uniform thickness of approximately 1 nm to approximately 30 nm, a metal layer 150a is deposited on the first organic layer 140, and then an oxidation process is performed using oxygen plasma to form the nanocrystal layer 150. To this end, under conditions that a pressure inside a chamber is in the range of approximately 10-6 Pa to approximately 10-3 Pa, a deposition rate is maintained at approximately 0.1 Å/s to approximately 5.0 Å/s, and a temperature is in the range of approximately 800° C. to approximately 1,500° C., the metal layer 150a with a thickness of approximately 1 nm to approximately 30 nm is formed on the first organic layer 140 by evaporating, for example, aluminum.

At this time, since the metal layer 150a has a high deposition rate, it is not formed in a nanocrystal shape but formed in the shape of a metal thin film having a grain boundary, which is illustrated in FIG. 21(a).

Afterwards, the substrate 100 with the metal layer 150a formed is loaded into a chamber for oxidation. The oxidation is performed by applying an RC power in the range of approximately 50 W to approximately 300 W, and an AC bias in the range of approximately 100 V to approximately 200 V, and supplying oxygen (O2) gas at a flow rate of approximately 100 sccm to approximately 200 sccm under a pressure of approximately 0.5 Pa to approximately 3.0 Pa. At this time, the oxidation process may be performed for approximately 30 seconds to approximately 500 seconds.

Resultingly, as illustrated in FIG. 21(b), oxygen plasma penetrates into the metal layer 150a along grain boundaries, and the metal layer 150a is thus oxidized along the grain boundaries. Therefore, as illustrated in FIG. 21(c), nanocrystals 151 having the same size are formed and a barrier layer 152 of an amorphous layer is formed on surfaces of the nanocrystals 151. The nanocrystal layer 150 may be formed to a thickness ranging from approximately 1 nm to approximately 30 nm according to a thickness of the metal layer 150a. Of course, the metal layer 150a may be formed thickly. However, if the metal layer 150a has a very great thickness, e.g., 150 nm or greater, the oxygen plasma cannot sufficiently penetrate into the grain boundaries of the metal layer 150a and thus the nanocrystal layer 150 may not formed effectively. As illustrated in FIG. 21(d), after the oxidation process is completed, the nanocrystal layer 150 may be configured with the nanocrystals 151 and the barrier layer 152 of AlxOy surrounding the nanocrystals 151.

The nanocrystal layer 150 may be formed in plurality by repeating the deposition of the metal layer 150a and the oxidation process several times. At this time, the plurality of nanocrystal layers 150 may have the same thickness or different thickness depending on a deposition thickness of the metal layer 150a. Particularly, it is effective that the nanocrystal layer 150 has a multi-layered structure of 1 to 10 layers with the same thickness.

Figure 20:
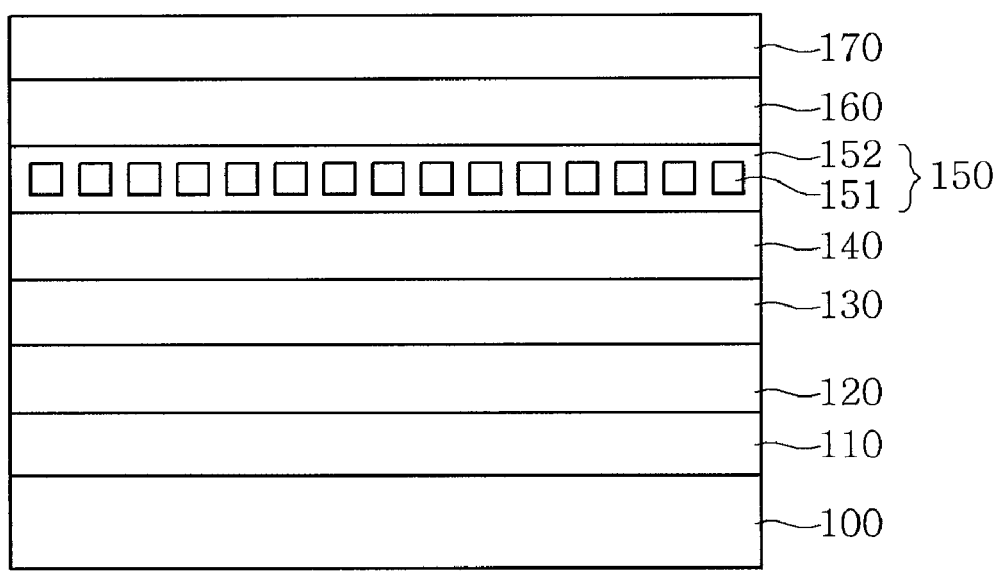

Referring to FIG. 20, a second organic layer 160 is formed on the nanocrystal layer 150. The second organic layer 160 is formed by evaporating an organic material under conditions that a pressure inside a chamber is in the range of approximately 10-5 Pa to approximately 10-3 Pa, a deposition rate is maintained at approximately 0.2 Å/s to approximately 2 Å/s, and a temperature is in the range of approximately 150° C. to approximately 400° C. The second organic layer 160 may be formed using AIDCN to a thickness ranging from approximately 10 nm to approximately 100 nm.

A third conductive layer 170 is formed on the substrate 100 including the second organic layer 160. The third conductive layer 170 is formed by evaporating a metallic material under conditions that a pressure inside a chamber is in the range of approximately 10-6 Pa to approximately 10-3 Pa, a deposition rate is maintained at approximately 2 Å/s to approximately 7 Å/s, and a temperature is in the range of approximately 1,000° C. to approximately 1,500° C. Especially, the third conductive layer 170 may be formed of Al to a thickness ranging from approximately 20 nm to approximately 150 nm.

The forming processes of the above layers may be performed in-situ in a vacuum atmosphere. That is, a conductive layer, an organic layer and a nanocrystal layer may be deposited in chambers inside a single deposition system. For example, the deposition may be implemented in a single deposition system where a chamber for a conductive layer, a chamber for an organic layer, a chamber of generating plasma for oxidation, a cooling chamber, a load-lock chamber and a shadow mask chamber are connected to one transfer module. When the substrate is transferred from a chamber for depositing the conductive layer to a chamber for depositing the organic layer, the substrate can be transferred within the transfer module in a vacuum state without exposure to air. However, the present invention is not limited to the single deposition system, and thus the chambers may be connected to different systems, respectively.

In the description above, the luminescent device can be manufactured through a shadow mask and a vacuum evaporation without an etching process. However, the present invention is not limited to thereto, and thus the luminescent device can be manufactured through a variety of methods. The conductive layer, the organic layer and the nanocrystal layer may be formed through E-beam deposition process, sputtering process, chemical vapor deposition (CVD) process, metal organic CVD (MOCVD), molecular beam epitaxy (MBE) process, physical vapor deposition (PVD), or atomic layer deposition (ALD) as well as thermal evaporation process. The conductive layer and the organic layer may be formed over a resultant structure, and then patterned into predetermined shapes through patterning process. That is, the conductive layer may be formed in such a way that a conductive material is formed on the substrate, and thereafter the conductive layer except for a region used for the conductive layer is removed through an etching process. In addition, the oxidation process may be performed using wet or dry oxidation.

In the method of manufacturing the luminescent device in accordance with the first exemplary embodiment, the first and second conductive layers 140 and 160 are formed of a low-molecular material such as AIDCN, Alq3 or α-NPD, and the nanocrystal layer 150 are formed by oxidizing the metal layer using oxygen plasma. Alternatively, the first and second organic layers 140 and 160 may be formed of a high-molecular material, and the nanocrystal layer may be formed through various methods such that the nanocrystals are surrounded by the barrier layer besides the method of forming the nanocrystal layer 150 through metal oxidation. Herebelow, another method of manufacturing a luminescent device will be described, in which the first and second organic layers 140 and 160 are formed of a high-molecular material. For convenience in description, duplicate descriptions, which have been made in the previous exemplary embodiment, will be omitted herein.

Figure 22:
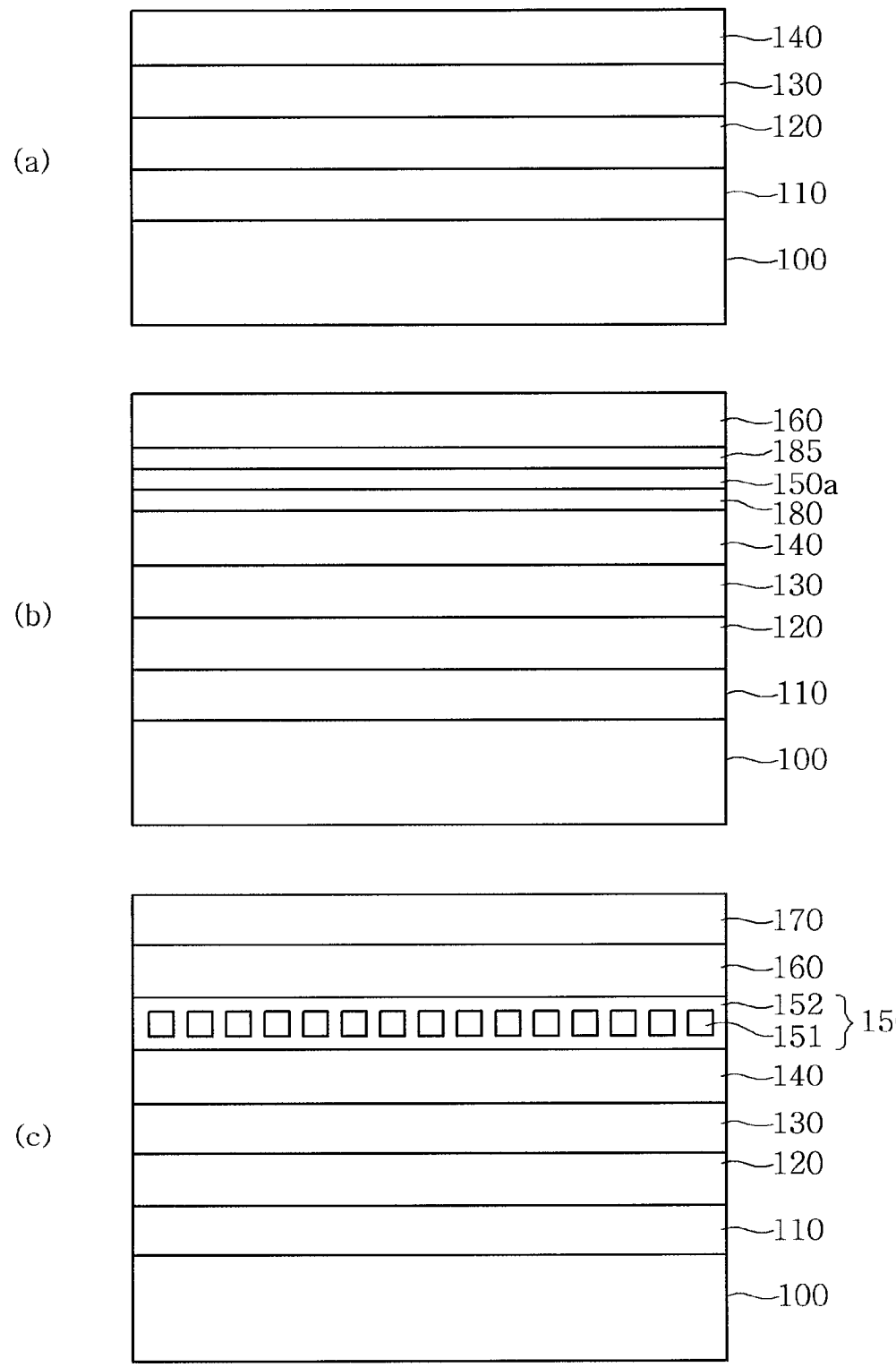
FIGS. 22(*a*) through 22(*d*) are cross-sectional views illustrating a method of manufacturing a luminescent device in accordance with a second exemplary embodiment.

FIGS. 22(*a*) through 22(*c*) are cross-sectional views illustrating a method of manufacturing a luminescent device in accordance with a second exemplary embodiment. In this exemplary embodiment, an organic layer is formed of a high-molecular material, and the nanocrystal layer is formed through deposition and curing process.

Referring to FIG. 22(*a*), a first conductive layer 110 is formed on a substrate 100. An organic layer 120, a second conductive layer 130 and a first organic layer 140 are formed on the first conductive layer 110. Herein, the first organic layer 140 may be formed of a high-molecular material such as PVK and Ps through spin-coating technique.

Referring to FIG. 22(*b*), a first barrier layer 180, a metal layer 150*a*, a second barrier layer 185, and a second organic layer 160 are sequentially formed on the first organic layer 140. Herein, the first and second barrier layers 180 and 185 serve as an electron tunneling barrier that surrounds nanocrystals in a nanocrystal layer. The first and second barrier layers 180 and 185 may be formed using a metal oxide such as Al2O3 and TiO2 through ALD process. The metal layer 150*a* may be formed through deposition process using an oxidizable material or a non-oxidizable material. In particular, the metal layer 150*a* may be formed of Au to a thickness ranging from approximately 1 nm to approximately 10 nm. The second organic layer 160 may be formed in like manner as the first organic layer 140. For example, the second organic layer 160 may be formed through spin-coating process using a high-molecular material such as PVK or Ps.

Referring to FIG. 22(*c*), a curing process is performed after the second organic layer 160 is formed. The first and second barrier layers 180 and 185 disposed over and under the metal layer 150*a* surround metal nanocrystals 151 in the metal layer 150*a*. As a result, a nanocrystal layer 150 is formed, which includes the nanocrystals 151 and the barrier layer 153 surrounding the nanocrystals 151. The curing process may be performed at approximately 150° C. to approximately 300° C. for approximately 0.5 hour to approximately 4 hours. After forming the nanocrystal layer 150, a third conductive layer 170 is formed on the substrate 100 including the second organic layer 160.

In the method of manufacturing the luminescent device in accordance with the second exemplary embodiment, a stacked structure, in which the first organic layer 140, the first barrier layer 180, the metal layer 150*a*, the second barrier layer 185 and the second organic layer 160 are sequentially formed, is cured to form the nanocrystal layer 150 including the nanocrystals 151 and the barrier layer 153 surrounding the nanocrystal 151, and the first and second organic layers 140 and 160 are formed of a high-molecular material. This method also makes it possible to ensure stable device characteristics in that the nanocrystal layer with uniform size and distribution can be formed in the luminescent device.

Figure 23:
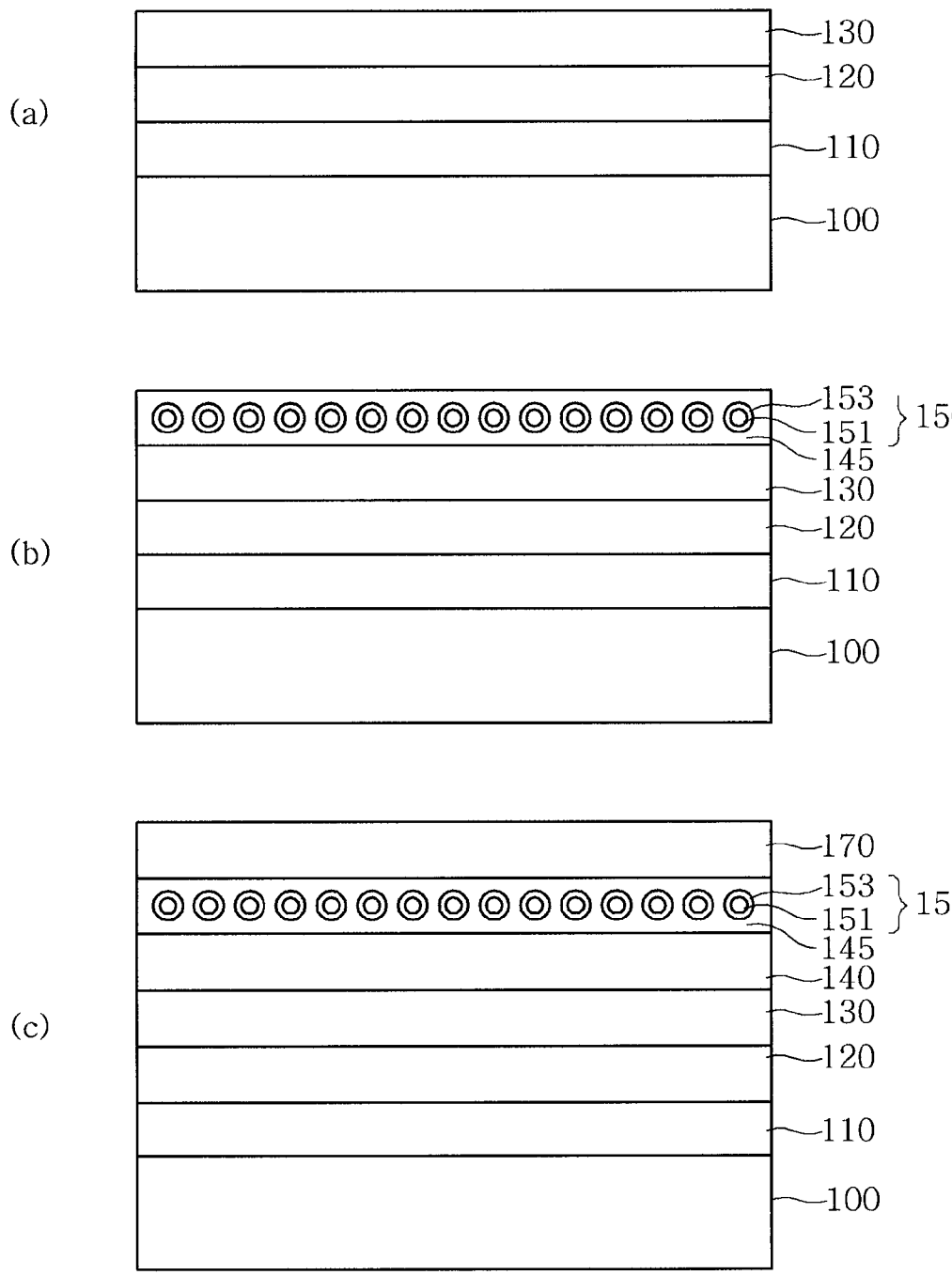
FIGS. 23(*a*) through 23(*c*) are cross-sectional views illustrating a method of manufacturing a luminescent device in accordance with a third exemplary embodiment.

FIGS. 23(*a*) through 23(*c*) are cross-sectional views illustrating a method of manufacturing a luminescent device in accordance with a third exemplary embodiment. In this embodiment, an organic layer and a nanocrystal layer are formed by depositing an organic material with nanocrystals dispersed.

Referring to FIG. 23(*a*), a first conductive layer 110 is formed on a substrate 100, then an organic luminescent layer 120 is formed on the first conductive layer 110, and thereafter a second conductive layer 130 is formed.

Referring to FIG. 23(*b*), an organic layer 145 where a plurality of nanocrystals 151 are dispersed is formed on the second conductive layer 130. Here, barrier layers 154 are formed to surround the respective nanocrystals 151. A method of forming an organic material in which the nanocrystals 151 surrounded by the barrier layers 154 are dispersed will be described later with reference to FIG. 24. The organic layer may be formed through spin-coating and thermal treatment. For example, the organic layer 145 may be formed by dropping an organic material with the nanocrystals 151 dispersed onto the substrate 100 while rotating the substrate 100 at approximately 1,500 rpm to approximately 3,000 rpm, and then performing the thermal treatment at approximately 100° C. to approximately 150° C. for approximately 30 minutes to approximately 90 minutes. Herein, the substrate 100 may be further rotated for approximately 50 seconds to approximately 100 seconds after the organic material is dropped, allowing the organic material to be conformally coated.

Referring to FIG. 23(*c*), a third conductive layer 170 is formed on the substrate 100 including the organic layer 145.

In the method of forming the luminescent device in accordance with the third exemplary embodiment, the barrier layers 154 surrounding the respective nanocrystals 151 serve as a tunneling barrier, and the organic layer 154 serves as a Schottky barrier. Alternatively, the nanocrystals 151 may be dispersed into the organic layer 145 without the formation of the barrier layers 154. Even in this case, the organic layer 145 serves as a Schottky barrier. Compared to the case where the barrier layers 154 is not formed, it is possible to improve device reliability and endurance if the barrier layers 154 is formed to surround the nanocrystals 151.

Figure 24:
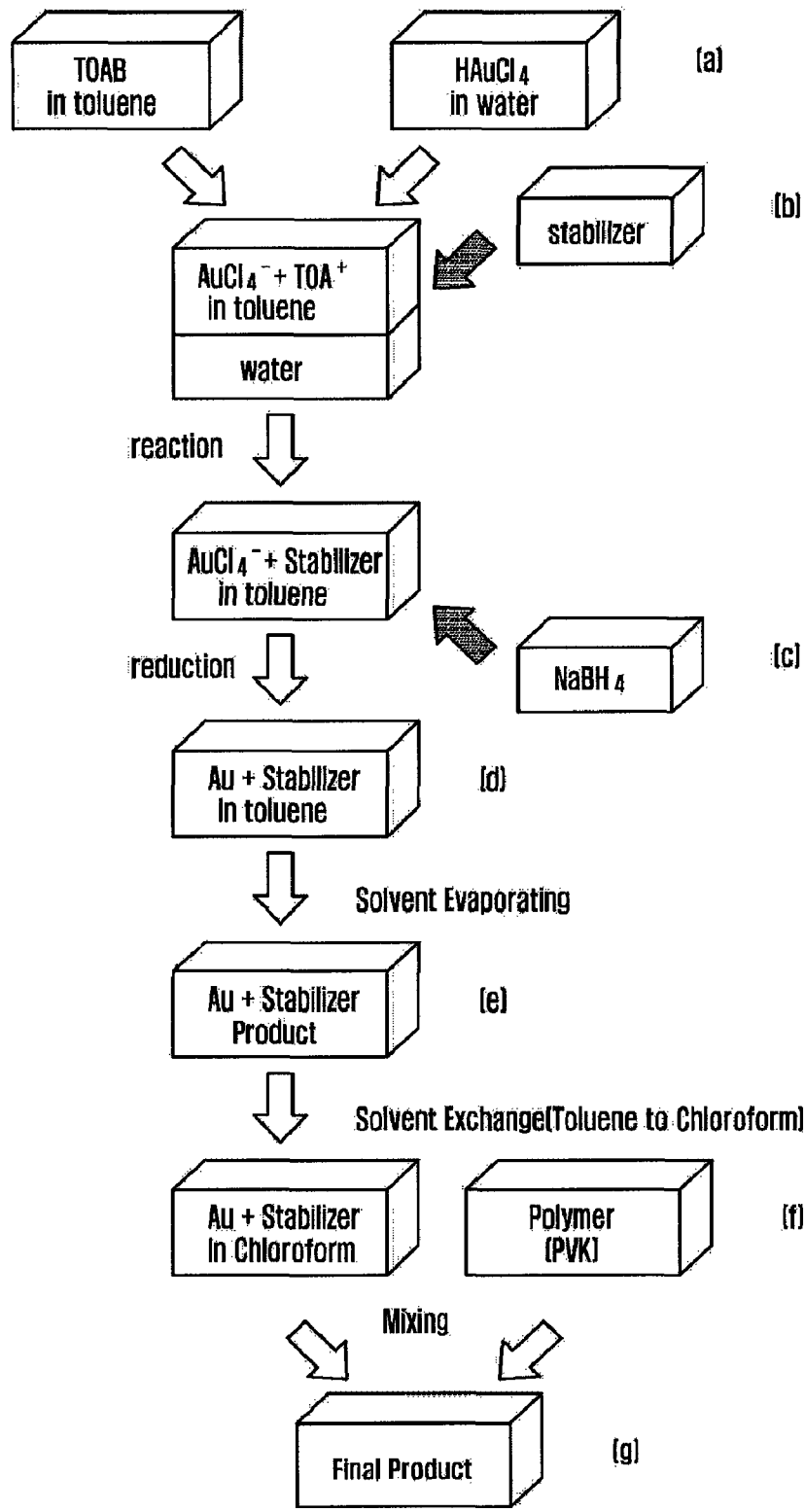
FIG. 24 illustrate a method of forming an organic layer in the method of manufacturing the luminescent device in accordance with the third exemplary embodiment.

FIG. 24 illustrates a method of forming an organic layer in FIG. 23(*b*) using the organic material with the nanocrystals surrounded by the barrier layers dispersed.

First, operations illustrated in FIGS. 24(*a*) through (*e*) are performed to synthesize the nanocrystals 151 surrounded by the barrier layer 153.

Referring to FIG. 24(*a*), a metal salt aqueous solution is prepared by dissolving a metal salt of HAuCl4 into water solvent, e.g., DI water. The metal salt is ionized in H+ and AuCl4− forms in the metal salt aqueous solution, and acts as Au source. A toluene solution including ionized tetraoctylammonium (TOAB) is prepared by dissolving TOAB into non-aqueous solvent, e.g., toluene. The ionized TOAB acts as a phase transfer catalyst allowing a metal-containing ion of AuCl4− to move into the toluene solution during a subsequent process.

Thereafter, referring to FIG. 24(*b*), the metal containing ions of AuCl4− moves to the toluene solution by agitating the metal salt aqueous solution and the toluene solution with the TOAB dissolved. The agitation may be performed at approximately 500 rpm or higher.

Carbazole terminated thiol (CB) as a stabilizer allowing Au nanocrystals to uniformly dispersed is added into the toluene solution, and the resultant mixture is then agitated. At this time, the agitation may be performed for approximately 5 minutes to approximately 20 minutes. The molecular formula of the CB stabilizer is $C_{23}H_{31}NS$, and its chemical name is 11-carbazolyl dodecane thiol.

Subsequently, referring to FIG. 24(c), sodium brohydride (NaBH4) as a reducing agent for reducing AuCl4− is added into the toluene solution with the CB added, and the resultant mixture is then agitated. At this time, the agitation may be performed at a room temperature for approximately 3 hours to approximately 10 hours at approximately 500 rpm or higher.

Resultingly, referring to FIG. 24(d), a combination material of an Au nanocrystal and the CB is formed in the toluene solution. Since the CB is formed to surround the Au nanocrystal, it serves as not only a stabilizer but also an electron tunneling barrier similar to barrier materials.

Afterwards, referring to FIG. 24(e), the combination material of the Au nanocrystal and the CB is left remaining by evaporating the toluene solvent. This evaporation may be performed under a relatively low-pressure condition of approximately −1 Bar or lower in a rotary evaporator.

Next, referring to FIG. 24(f), the combination material of the Au nanocrystal and the CB is dissolved into chloroform to be mixed with a high-molecular material. A high-molecular material, e.g., PVK, is mixed into chloroform solution.

Finally, referring to FIG. 24(g), a final product solution is produced, in which the Au nanocrystal surrounded by the CB and the high-molecular material are mixed. This final product solution is spin-coated on the substrate to thereby form the organic layer 145 illustrated in FIG. 24(b). In this exemplary embodiment, the nanocrystal 151 dispersed into the organic layer 145 may be Au, and the barrier 153 surrounding the nanocrystal 151 may be CB.

Even in the case of employing the method in accordance with the third exemplary embodiment, it is possible to form the nanocrystals with uniform size and distribution. In particular, this method is advantageous in that a manufacturing process is simple and mass-production is possible because the nanocrystal layer including the nanocrystals can be formed at a time through spin coating.

Although the exemplary embodiments illustrate that the organic luminescent layer is formed on the substrate first, and then the charge trapping layer including the nanocrystal layer is formed on the organic luminescent layer, this process sequence is not limited thereto. That is, the charge trapping layer including the nanocrystal layer may be formed on the substrate first, and then the organic luminescent layer may be formed on the charge trapping layer.

Further, it is possible to manufacture a top emission type luminescent device or a bottom emission type luminescent device using different electrode materials.

The invention claimed is:

1. A luminescent device, comprising:
a charge trapping layer having bistable conductance and negative differential resistance (NDR) characteristics; and
an organic luminescent layer electrically connected to the charge trapping layer,
wherein the charge trapping layer comprise a nanocrystal layer intervened in an organic layer, and the nanocrystal layer comprises a plurality of nanocrystals.

2. The luminescent device of claim 1, further comprising an upper conductive layer and a lower conductive layer disposed over and under the charge trapping layer and the organic luminescent layer, respectively.

3. The luminescent device of claim 2, further comprising an intermediate conductive layer disposed between the charge trapping layer and the organic luminescent layer.

4. The luminescent device of claim 3, further comprising at least one of a hole injection layer and a hole transport layer disposed between the organic luminescent layer and one of the conductive layers.

5. The luminescent device of claim 4, further comprising at least one of an electron transport layer and an electron injection layer disposed between the organic luminescent layer and another one of the conductive layers.

6. The luminescent device of claim 1, wherein the nanocrystal layer further comprises a barrier layer surrounding the plurality of nanocrystals.

7. The luminescent device of claim 1, wherein the nanocrystal comprises at least one of Al, Ti, Zn, Fe, Ni, Cu, Au, Ag and an alloy thereof.

8. The luminescent device of claim 6, wherein the barrier layer comprises an oxide.

9. The luminescent device of claim 6, wherein the barrier layer comprises an organic material.

10. The luminescent device of claim 1, wherein the organic layer comprises at least one of a low-molecular organic material and a high-molecular organic material.

11. The luminescent device of claim 1, wherein the organic luminescent layer comprises at least one of a low-molecular organic material and a high-molecular organic material.

12. The luminescent device of claim 2, wherein the luminescent device performs a program operation, an erase operation or a read operation depending on a level of a voltage applied between the upper conductive layer and the lower conductive layer, and
the luminescent device emits light during the read operation.

13. The luminescent device of claim 12, wherein an absolute value of a voltage for the erase operation is greater than an absolute value of a voltage for the program operation; and
an absolute value of a voltage for the read operation is smaller than the absolute value of the voltage for the program operation.

14. The luminescent device of claim 13, wherein the program voltage, the erase voltage and the read voltage are positive voltages.

15. The luminescent device of claim 13, wherein the program voltage, the erase voltage and the read voltage are negative voltages.

16. The luminescent device of claim 12, wherein program voltages having a plurality of levels are applied between the upper and lower conductive layers to perform the program operation, and the program voltages are selected in the range from a threshold voltage of the luminescent device to an NDR region, and
currents having a plurality of levels are output during the read operation depending on levels of the program voltages.

17. The luminescent device of claim 16, wherein read voltages having a plurality of levels are applied between the upper and lower conductive layers to perform the read operation,
the read voltages are selected from a range less than the threshold voltage of the luminescent device, and
currents having a plurality of levels are output during the read operation depending on levels of the read voltages.

18. The luminescent device of claim 12, wherein read voltages having a plurality of levels are applied between the upper and lower conductive layers to perform the read operation,
the read voltages are selected from a range less than the threshold voltage of the luminescent device, and currents having a plurality of levels are output during the read operation depending on levels of the read voltages.

19. The luminescent device of claim 1, wherein the luminescent device is a bottom emission type or a top emission type luminescent device.

20. The luminescent device of claim 1, further comprising a flexible substrate.

21. A method of manufacturing a luminescent device, the method comprising:
   forming a lower conductive layer on a substrate;
   forming an upper conductive layer on the lower conductive layer;
   forming a charge trapping layer having bistable conductance and NDR characteristics between the lower conductive layer and the upper conductive layer; and
   forming an organic luminescent layer between the lower conductive layer and the upper conductive layer to be electrically connected to the charge trapping layer,
   wherein forming the charge trapping layer further comprises forming a nanocrystal layer in an organic layer.

22. The method of claim 21, wherein the organic layer comprises a lower organic layer and an upper organic layer, and the organic layer comprises a low-molecular conductive organic material.

23. The method of claim 22, wherein forming the nanocrystal layer comprises:
   forming a metal layer between the lower organic layer and the upper organic layer, and oxidizing the metal layer to form a nanocrystal and a barrier layer surrounding the nanocrystal.

24. The method of claim 23, wherein oxidizing the metal layer is performed using oxygen plasma.

25. The method of claim 21, wherein the organic layer comprises a lower organic layer and an upper organic layer, and the lower and upper organic layers comprise a high-molecular conductive organic material.

26. The method of claim 25, wherein forming the nanocrystal layer comprises:
   forming a first barrier layer, a metal layer and a second barrier layer between the lower and the upper organic layers; and
   performing a curing process to form a nanocrystal and a barrier layer surrounding the nanocrystal, the barrier layer being formed from the first barrier layer and the second barrier layer.

27. The method of claim 26, wherein the first and second barrier layers comprise a metal oxide.

28. The method of claim 21, wherein the organic layer and the nanocrystal layer is formed by dispersing a nanocrystal into an organic material, spin-coating the organic material onto the substrate, and then performing heat treatment.

29. The method of claim 28, wherein the nanocrystal layer comprises the nanocrystal and a barrier layer surrounding the nanocrystal, and the nanocrystal layer is formed by adding and dispersing a barrier material into the organic material, spin-coating the organic material onto the substrate, and performing heat treatment.

30. The method of claim 21, further comprising forming an intermediate conductive layer between the organic layer and the organic luminescent layer.

31. The method of claim 21, wherein the substrate is a flexible substrate.

* * * * *